(12) United States Patent
Yamazaki et al.

(10) Patent No.: US 9,466,726 B2
(45) Date of Patent: Oct. 11, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Masahiko Hayakawa, Atsugi (JP); Satoshi Shinohara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/694,166

(22) Filed: Apr. 23, 2015

(65) Prior Publication Data

US 2015/0228800 A1    Aug. 13, 2015

Related U.S. Application Data

(63) Continuation of application No. 14/244,401, filed on Apr. 3, 2014, now Pat. No. 9,053,983, which is a continuation of application No. 13/626,226, filed on Sep. 25, 2012, now Pat. No. 8,716,708.

(30) Foreign Application Priority Data

Sep. 29, 2011   (JP) .................. 2011-215599

(51) Int. Cl.
*H01L 29/786* (2006.01)
*H01L 29/417* (2006.01)
(Continued)

(52) U.S. Cl.
CPC ....... *H01L 29/7869* (2013.01); *H01L 27/1225* (2013.01); *H01L 29/24* (2013.01); *H01L 29/41733* (2013.01); *H01L 29/78606* (2013.01)

(58) Field of Classification Search
CPC ................ H01L 29/7869; H01L 29/78693
See application file for complete search history.

(56) References Cited

U.S. PATENT DOCUMENTS 5,286,659 A    2/1994   Mitani et al.
5,462,886 A    10/1995  Sakai et al.
(Continued)

FOREIGN PATENT DOCUMENTS

CN    001091151 A    8/1994
CN    001257307 A    6/2000
(Continued)

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

(Continued)

*Primary Examiner* — Matthew W. Such
*Assistant Examiner* — Scott Stowe
(74) *Attorney, Agent, or Firm* — Eric J. Robinson; Robinson Intellectual Property Law Office, P.C.

(57) ABSTRACT

Provided is a bottom-gate transistor including an oxide semiconductor, in which electric-field concentration which might occur in the vicinity of an end portion of a drain electrode layer (and the vicinity of an end portion of a source electrode layer) when a high gate voltage is applied to a gate electrode layer is reduced and degradation of switching characteristics is suppressed, so that the reliability is improved. The cross-sectional shape of an insulating layer which overlaps over a channel formation region is a tapered shape. The thickness of the insulating layer which overlaps over the channel formation region is 0.3 μm or less, preferably 5 nm or more and 0.1 μm or less. The taper angle θ of a lower end portion of the cross-sectional shape of the insulating layer which overlaps over the channel formation region is 60° or smaller, preferably 45° or smaller, further preferably 30° or smaller.

20 Claims, 20 Drawing Sheets

(51) Int. Cl.
   *H01L 27/12* (2006.01)
   *H01L 29/24* (2006.01)

(56) References Cited

U.S. PATENT DOCUMENTS

| | | | |
|---|---|---|---|
| 5,473,168 A | 12/1995 | Kawai et al. |
| 5,474,941 A | 12/1995 | Mitani et al. |
| 5,530,265 A | 6/1996 | Takemura |
| 5,610,082 A | 3/1997 | Oh |
| 5,726,461 A | 3/1998 | Shimada et al. |
| 5,731,856 A | 3/1998 | Kim et al. |
| 5,744,864 A | 4/1998 | Cillessen et al. |
| 5,825,050 A | 10/1998 | Hirakawa |
| 6,197,624 B1 | 3/2001 | Yamazaki |
| 6,204,519 B1 | 3/2001 | Yamazaki et al. |
| 6,229,156 B1 | 5/2001 | Murai et al. |
| 6,242,758 B1 | 6/2001 | Yamazaki et al. |
| 6,294,274 B1 | 9/2001 | Kawazoe et al. |
| 6,362,507 B1 | 3/2002 | Ogawa et al. |
| 6,380,011 B1 | 4/2002 | Yamazaki et al. |
| 6,562,669 B2 | 5/2003 | Suzawa et al. |
| 6,563,174 B2 | 5/2003 | Kawasaki et al. |
| 6,567,136 B1 | 5/2003 | Sakuramoto et al. |
| 6,727,522 B1 | 4/2004 | Kawasaki et al. |
| 6,909,114 B1 | 6/2005 | Yamazaki |
| 7,022,556 B1 | 4/2006 | Adachi |
| 7,037,779 B2 | 5/2006 | Nakajima |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,037 B2 | 7/2006 | Suzawa et al. |
| 7,105,868 B2 | 9/2006 | Nause et al. |
| 7,172,928 B2 | 2/2007 | Yamazaki |
| 7,211,454 B2 | 5/2007 | Yamazaki et al. |
| 7,211,825 B2 | 5/2007 | Shih et al |
| 7,273,773 B2 | 9/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,543 B2 | 10/2008 | Yamazaki |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,563,658 B2 | 7/2009 | Ishizuka et al. |
| 7,674,650 B2 | 3/2010 | Akimoto et al. |
| 7,732,819 B2 | 6/2010 | Akimoto et al. |
| 7,791,075 B2 | 9/2010 | Kobayashi et al. |
| 7,859,187 B2 | 12/2010 | Yamazaki et al. |
| 8,013,338 B2 | 9/2011 | Kobayashi et al. |
| 8,049,275 B2 | 11/2011 | Yamazaki |
| 8,058,652 B2 | 11/2011 | Honda |
| 8,174,021 B2 | 5/2012 | Oikawa et al. |
| 8,188,477 B2 | 5/2012 | Miyairi et al. |
| 8,242,496 B2 | 8/2012 | Yamazaki et al. |
| 8,247,812 B2 | 8/2012 | Sakata et al. |
| 8,546,811 B2 | 10/2013 | Godo et al. |
| 8,680,532 B2 | 3/2014 | Yamazaki |
| 8,716,708 B2 | 5/2014 | Yamazaki et al. |
| 8,848,124 B2 | 9/2014 | Ikeda et al. |
| 8,957,422 B2 | 2/2015 | Yamazaki |
| 9,391,209 B2 | 7/2016 | Godo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0004220 A1 | 1/2004 | Suzuki |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0148141 A1 | 7/2006 | Seo et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025675 A1 | 2/2010 | Yamazaki et al. |
| 2010/0025677 A1 | 2/2010 | Yamazaki et al. |
| 2010/0065844 A1 | 3/2010 | Tokunaga |
| 2010/0072467 A1 | 3/2010 | Yamazaki et al. |
| 2010/0072470 A1 | 3/2010 | Yamazaki et al. |
| 2010/0084650 A1 | 4/2010 | Yamazaki et al. |
| 2010/0084654 A1 | 4/2010 | Yamazaki et al. |
| 2010/0092800 A1 | 4/2010 | Itagaki et al. |
| 2010/0109002 A1 | 5/2010 | Itagaki et al. |
| 2010/0155719 A1 | 6/2010 | Sakata et al. |
| 2010/0244029 A1 | 9/2010 | Yamazaki et al. |
| 2011/0006301 A1 | 1/2011 | Yamazaki et al. |
| 2011/0006302 A1 | 1/2011 | Yamazaki et al. |
| 2011/0008931 A1 | 1/2011 | Yamazaki et al. |
| 2011/0012106 A1 | 1/2011 | Yamazaki et al. |
| 2011/0012117 A1 | 1/2011 | Yamazaki et al. |

(56) References Cited

U.S. PATENT DOCUMENTS

| | | |
|---|---|---|
| 2011/0017995 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0049518 A1 | 3/2011 | Noda |
| 2011/0068334 A1 | 3/2011 | Yamazaki et al. |
| 2011/0084266 A1 | 4/2011 | Yamazaki et al. |
| 2011/0084267 A1 | 4/2011 | Yamazaki et al. |
| 2011/0084268 A1 | 4/2011 | Yamazaki et al. |
| 2011/0084270 A1 | 4/2011 | Yamazaki |
| 2011/0193081 A1 | 8/2011 | Godo et al. |
| 2011/0210332 A1 | 9/2011 | Jintyou et al. |
| 2011/0248260 A1 | 10/2011 | Yamazaki |
| 2012/0175608 A1 | 7/2012 | Yamazaki |
| 2012/0175610 A1 | 7/2012 | Yamazaki |
| 2012/0262642 A1 | 10/2012 | Ikeda et al. |
| 2015/0228703 A1 | 8/2015 | Yamazaki |

FOREIGN PATENT DOCUMENTS

| | | |
|---|---|---|
| EP | 0493113 A | 7/1992 |
| EP | 0519692 A | 12/1992 |
| EP | 1003223 A | 5/2000 |
| EP | 1737044 A | 12/2006 |
| EP | 2226847 A | 9/2010 |
| EP | 2259292 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-369229 A | 12/1992 |
| JP | 05-251705 A | 9/1993 |
| JP | 08-264794 A | 10/1996 |
| JP | 10-135463 A | 5/1998 |
| JP | 10-209458 A | 8/1998 |
| JP | 11-505377 | 5/1999 |
| JP | 2000-044236 A | 2/2000 |
| JP | 2000-150900 A | 5/2000 |
| JP | 2000-180899 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-181917 A | 9/2011 |
| TW | 200400643 | 1/2004 |
| WO | WO-2004/114391 | 12/2004 |
| WO | WO-2011/037102 | 3/2011 |
| WO | WO-2011/096275 | 8/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IgZo Transparent Amorphous Oxide Semiconductor", IDW '08 : Proceedings of the 15th International Display Workshops. Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GiZo ($Ga_2O_3$-$In_2O_3$-ZnO) TFT", SID Digest '08 : SID International Symposium Digest of Technical Papers, May 20, 2008, vol. 39, pp. 633-636.

Lee.J et al., "World's Largest (15-Inch) XGA AMCLD Panel Using IgZo Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2009, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Parkj et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physical Letters, Sep. 10, 1973, vol. 45A, No. 2, pp. 115-116.
Eng. Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display with Driver Circuit Using Amorphous In-Ga-Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous-In-Ga-Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTs with a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composited for Display Applications", SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID Internatioanl Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-Bo Systems [A; Fe, Ga, Or Al; B: Mg, Mn, Fe, Ni, Cu,Or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMMOLED Displays", IDW '08 : Proceedings of The 16th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 101135101) Dated Jan. 12, 2016.

Chinese Office Action (Application No. 201210368465.3) Dated May 3, 2016.

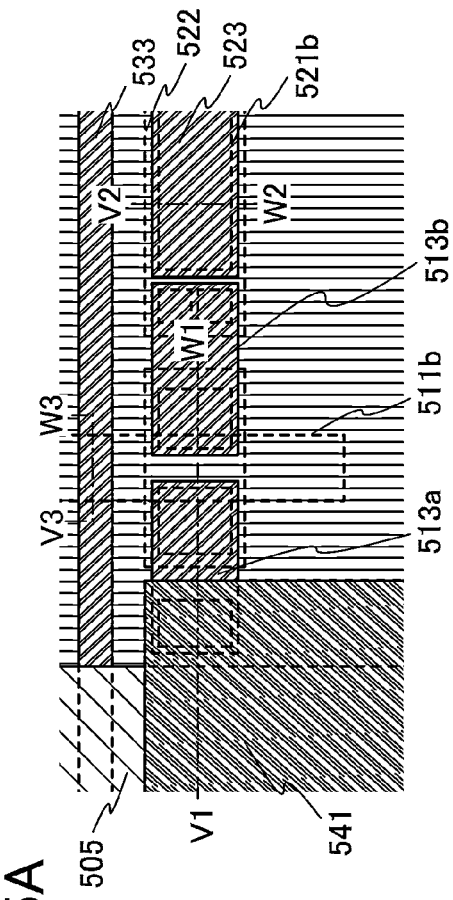
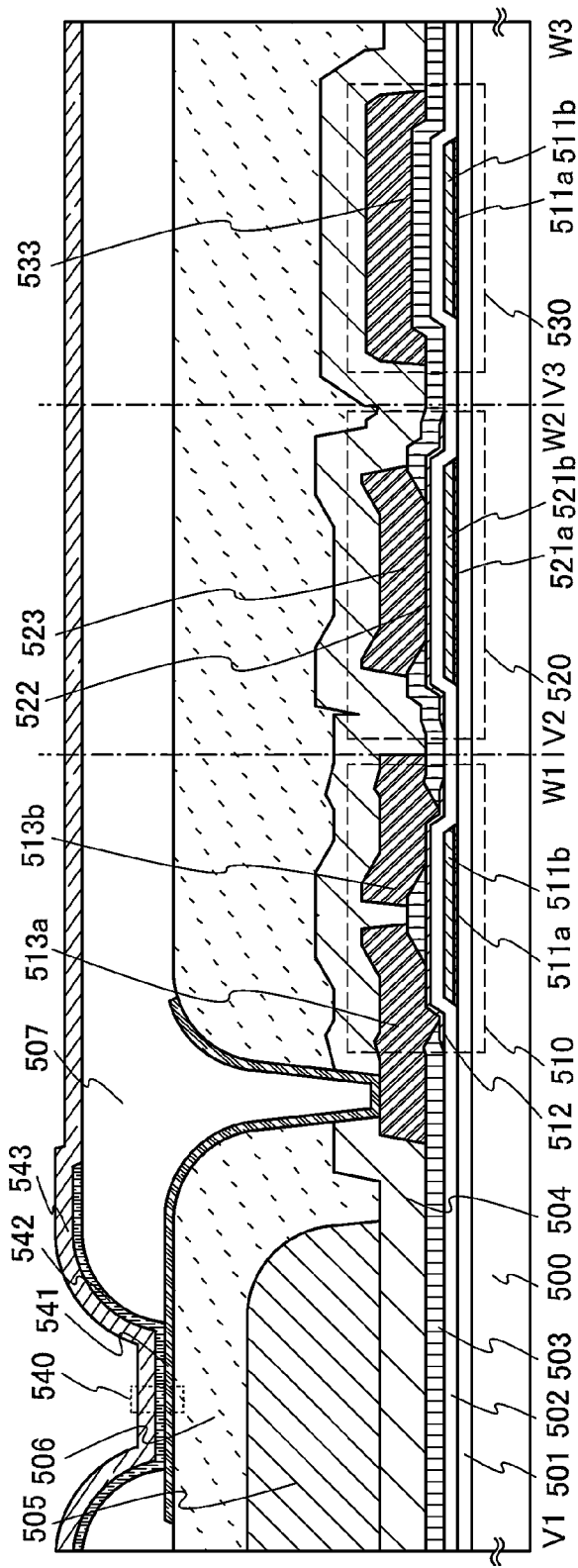
FIG. 15A
FIG. 15B

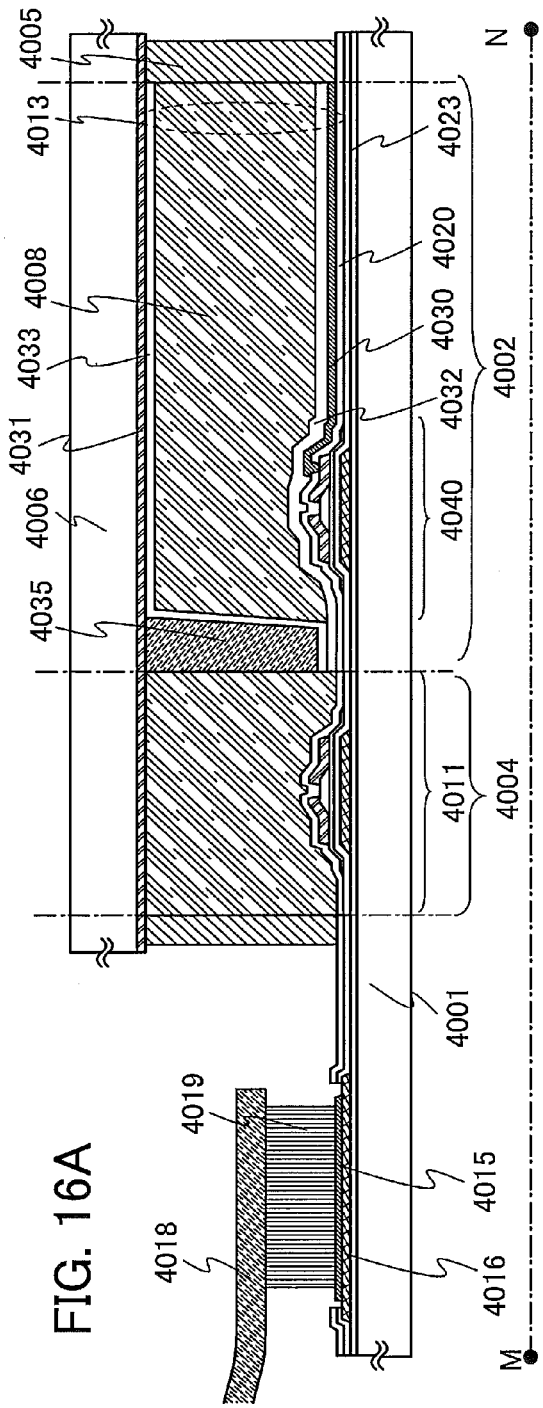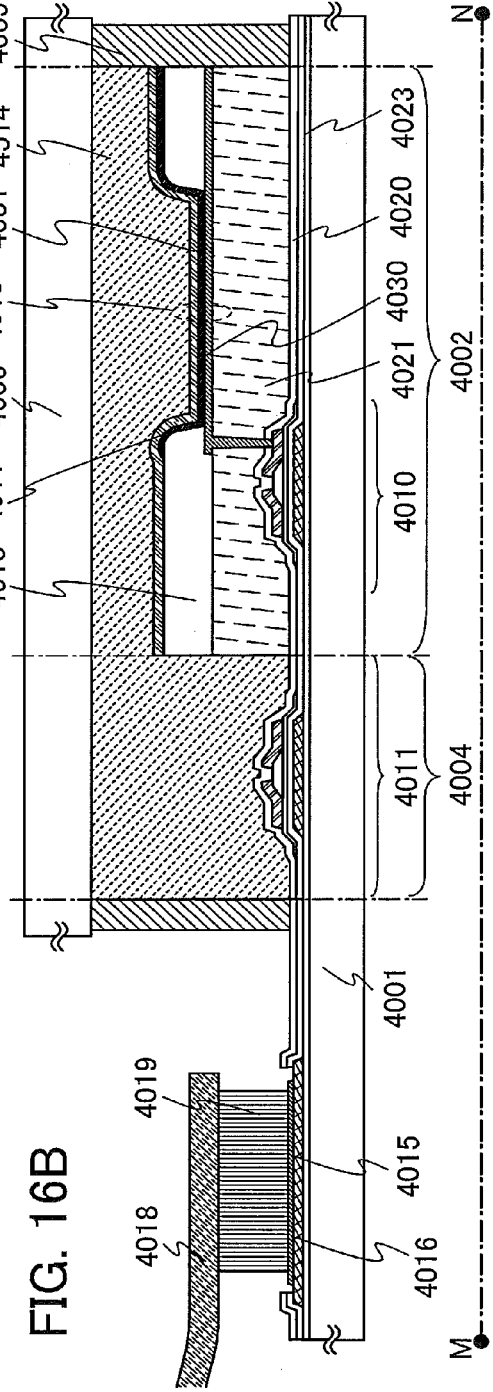

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

In recent years, a semiconductor device has been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique for manufacturing a transistor or the like by using an oxide semiconductor film for a channel formation region has been attracting attention. Examples of such a transistor include a transistor in which zinc oxide (ZnO) is used for an oxide semiconductor film and a transistor in which $InGaO_3(ZnO)_m$ is used for an oxide semiconductor film. A technique for manufacturing such a transistor including an oxide semiconductor film over a light-transmitting substrate and applying it to a switching element or the like of an image display device is disclosed in Patent Documents 1 and 2.

REFERENCE

Patent Document

[Patent Document 1] Japanese Published Patent Application No. 2007-123861
[Patent Document 2] Japanese Published Patent Application No. 2007-096055

SUMMARY OF THE INVENTION

A transistor in which a channel formation region is formed in an oxide semiconductor has higher field effect mobility than a transistor formed using amorphous silicon. The field effect mobility of the transistor formed using amorphous silicon is approximately 0.5 $cm^2/V \cdot s$ in general, whereas the field effect mobility of the transistor formed using an oxide semiconductor is 10 $cm^2/V \cdot s$ to 20 $cm^2/V \cdot s$, or higher. In addition, an active layer can be formed by a sputtering method or the like when using an oxide semiconductor material; thus, the manufacturing process of the transistor including an oxide semiconductor is simpler than that of a transistor including polycrystalline silicon formed using a laser device.

Application of a transistor formed over a glass substrate or a plastic substrate using such an oxide semiconductor to a liquid crystal display device, an organic EL display device, electronic paper, or the like has been under consideration.

On the other hand, display devices having large display areas are coming into widespread use. Home-use televisions with display screens having a diagonal of 40 inches to 50 inches have begun to spread and will be further widespread in the future. As described above, the field effect mobility of the transistor formed using an oxide semiconductor is ten times or more as high as that of the transistor formed using amorphous silicon; thus, the transistor formed using an oxide semiconductor can have sufficient properties to be used as a switching element of a pixel in a display device having a large display area. A transistor used in a display device needs to have a high withstand voltage.

An object of one embodiment of the present invention is to provide a highly reliable display device in which a transistor including an oxide semiconductor, which has favorable electrical characteristics and high reliability, is used as a switching element, and to provide a method for manufacturing the display device.

Another object is to provide a bottom-gate transistor including an oxide semiconductor, in which electric-field concentration which might occur in the vicinity of an end portion of a drain electrode layer (and the vicinity of an end portion of a source electrode layer) when a high gate voltage is applied to a gate electrode layer is reduced and degradation of switching characteristics is suppressed, so that the reliability is improved, and to provide a method for manufacturing the transistor.

In the bottom-gate transistor, a channel formation region is formed using an oxide semiconductor and an insulating layer (also referred to as a channel stop layer) is provided over the channel formation region so as to overlap therewith. In one embodiment of the present invention, the electric-field concentration which might occur in the vicinity of the end portion of the drain electrode layer (and the vicinity of the end portion of the source electrode layer) is reduced and degradation of the switching characteristics is suppressed by devising a cross-sectional shape of the insulating layer which overlaps over the channel formation region, specifically, a cross-sectional shape of an end portion of the insulating layer (e.g., the taper angle θ or the film thickness).

Specifically, the cross-sectional shape of the insulating layer which overlaps over the channel formation region is a trapezoid or a triangle, and the taper angle θ of a lower end portion of the cross-sectional shape is smaller than or equal to 60°, preferably smaller than or equal to 45°, further preferably smaller than or equal to 30°. When the angle is set in such a range, the electric-field concentration which might occur in the vicinity of the end portion of the drain electrode layer (and the vicinity of the end portion of the source electrode layer) when a high gate voltage is applied to the gate electrode layer can be reduced.

Further, the thickness of the insulating layer which overlaps over the channel formation region is less than or equal to 0.3 μm, preferably greater than or equal to 5 nm and less than or equal to 0.1 μm. When the film thickness is set in such a range, a peak of the electric field intensity can be reduced, or the electric field can be distributed so that the electric-field concentration occurs in a plurality of regions, which results in a reduction in electric-field concentration which might occur in the vicinity of the end portion of the drain electrode layer.

One embodiment of the present invention disclosed in this specification is a semiconductor device including a gate electrode layer over an insulating surface, a gate insulating film over the gate electrode layer, an oxide semiconductor film including a channel formation region over the gate insulating film, an insulating layer on and in contact with the oxide semiconductor film, a source electrode layer having an end portion over the insulating layer, and a drain electrode layer having an end portion over the insulating layer. The end portion of the source electrode layer and the end portion of the drain electrode layer overlap with the channel formation region with the insulating layer provided therebetween. An end portion of the insulating layer is tapered and the thickness of the insulating layer is less than or equal to 0.3 μm, preferably greater than or equal to 5 nm and less than or equal to 0.1 μm.

One embodiment of the present invention is a semiconductor device including a gate electrode layer over an insulating surface, a gate insulating film over the gate electrode layer, an oxide semiconductor film including a channel formation region over the gate insulating film, an insulating layer on and in contact with the oxide semiconductor film, a source electrode layer having an end portion over the insulating layer, and a drain electrode layer having an end portion over the insulating layer. The end portion of the source electrode layer and the end portion of the drain electrode layer overlap with the channel formation region with the insulating layer provided therebetween. An angle between a side surface of an end portion of the insulating layer and the insulating surface is smaller than or equal to 60°, preferably smaller than or equal to 45°, further preferably smaller than or equal to 30°. The thickness of the insulating layer is less than or equal to 0.3 μm, preferably greater than or equal to 5 nm and less than or equal to 0.1 μm.

In the above structure, the end portion of the drain electrode layer may overlap with the top surface of the insulating layer. The drain electrode layer also functions as a light-blocking film which blocks entry of light from the outside to the oxide semiconductor film. In the case where the drain electrode layer functions as a light-blocking film, the end portion of the source electrode layer may be positioned so that a short circuit between the end portion of the source electrode layer and the end portion of the drain electrode layer does not occur.

In the case where the angle between the side surface of the end portion of the insulating layer and the insulating surface is small, the width of the side surface of the insulating layer (also referred to as the width of a tapered portion) is widened; thus, it is preferable to reduce the parasitic capacitance of a portion where the drain electrode layer overlaps with the gate electrode layer. In that case, the end portion of the drain electrode layer may overlap with the side surface of the end portion of the insulating layer.

In the end portion of the insulating layer, the taper angle θ is an angle between a side surface of a lower end portion of a cross-sectional shape of the insulating layer and a principal plane of the substrate. Note that when a surface of the oxide semiconductor film, which is in a region where the insulating layer is provided, is flat and can be regarded as being substantially parallel to the principal plane of the substrate, the taper angle θ is an angle between the side surface of the lower end portion and the flat surface of the oxide semiconductor film.

The cross-sectional shape of the end portion of the insulating layer which overlaps over the channel formation region is not particularly limited to a trapezoid or a triangle. At least part of the side surface of the insulating layer which overlaps over the channel formation region may be curved. For example, in the cross-sectional shape of the end portion of the insulating layer, the lower end portion of the insulating layer may have one curved surface which is determined by the center of the circle of curvature, which is positioned outside the insulating layer. The cross-sectional shape of the end portion of the insulating layer may be a shape whose width is spread from the top surface of the insulating layer toward the substrate.

The insulating layer having any of the above cross-sectional shapes is formed by dry etching or wet etching. As an etching apparatus used for the dry etching, an etching apparatus using a reactive ion etching method (RIE method), or a dry etching apparatus using a high-density plasma source such as electron cyclotron resonance (ECR) or inductively coupled plasma (ICP) can be used. As a dry etching apparatus by which uniform electric discharge can be performed over a large area as compared to an ICP etching apparatus, there is an enhanced capacitively coupled plasma (ECCP) mode apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be used even when a substrate of the tenth generation, the size of which exceeds 3 m, is used as the substrate, for example.

In the case where the cross-sectional shape of the insulating layer which overlaps over the channel formation region is a trapezoid or a triangle, the insulating layer is etched while a resist mask is eroded to make the cross-sectional shape of the insulating layer in the shape of a trapezoid or a triangle. Note that in this specification, the cross-sectional shape refers to a cross-sectional shape taken along a plane perpendicular to the principal plane of the substrate.

With an optimized cross-sectional shape of the insulating layer, the electric-field concentration which might occur in the vicinity of the end portion of the drain electrode layer and the vicinity of the end portion of the source electrode layer can be reduced and degradation of the switching characteristics can be suppressed, so that the reliability can be improved.

BRIEF DESCRIPTION OF THE DRAWINGS

FIGS. 15A and 15B are a plan view and a cross-sectional view illustrating one embodiment of a semiconductor device.

FIGS. 16A and 16B are cross-sectional views each illustrating one embodiment of a semiconductor device.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Thus, the present invention is not construed as being limited to description of the embodiments.

(Embodiment 1)

Potential distribution in the vicinity of a drain of a transistor in which a cross-sectional shape of an insulating layer which overlaps over a channel formation region is a trapezoid at the time of application of gate bias was calculated. For the calculation, simulation software (Sentaurus Device) manufactured by Synopsys, Inc. was used.

Figure 1A:
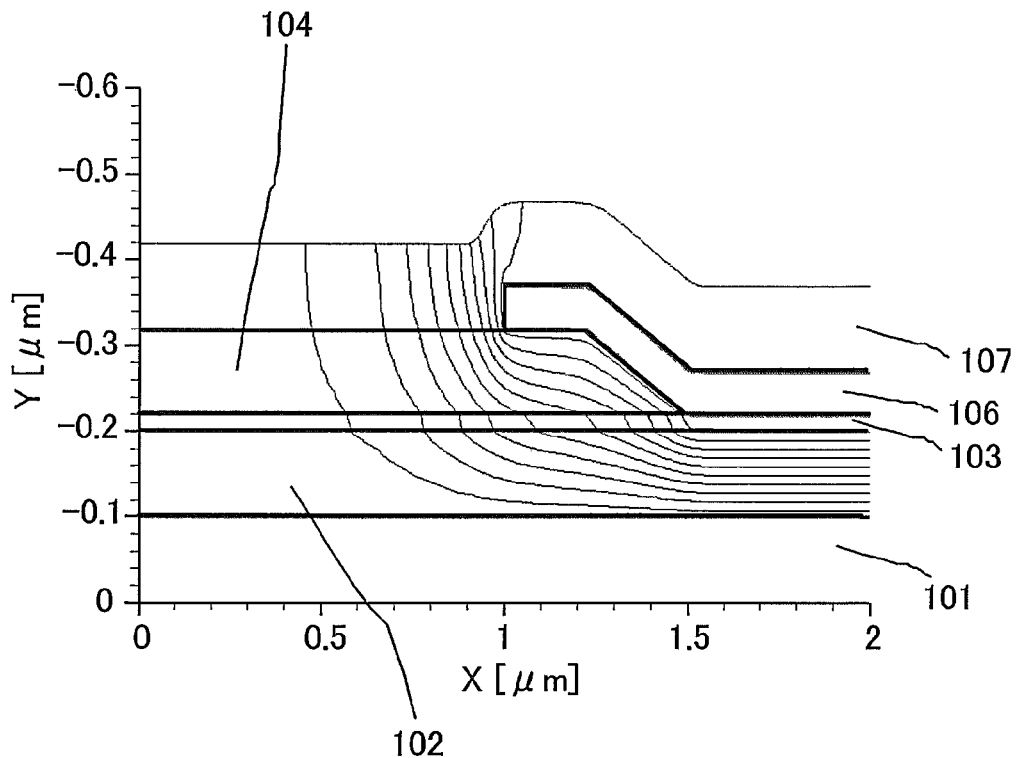
FIGS. 1A and 1B show a cross-sectional structure illustrating one embodiment of the present invention and calculation results concerning the cross-sectional structure.

A transistor illustrated in FIG. 1A, that is, a transistor having a bottom-gate structure (channel-stop structure) including, over a gate insulating film 102 having a thickness of 100 nm provided over a gate electrode layer 101, an oxide semiconductor film 103 having a thickness of 20 nm and an insulating layer 104 (channel stop layer) having a thickness of 100 nm are stacked in that order; a source electrode layer and a drain electrode layer 106 provided over the insulating layer 104; and a protective insulating film 107 which covers the source electrode layer and the drain electrode layer 106 is used as a calculation model. A taper angle of a lower end portion of the insulating layer 104 is 30°.

Figure 1B:
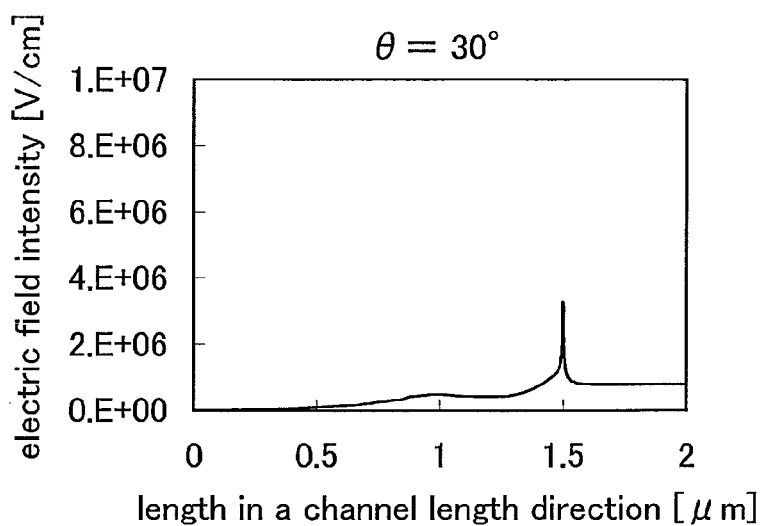

FIG. 1A shows equipotential lines in the case where −30 V is applied to the gate electrode layer 101 and potential applied to the drain electrode layer 106 is set to 0 V. FIG. 1B is a graph whose ordinate represents the electric field intensity at a back channel of the oxide semiconductor film 103, that is, the interface of the oxide semiconductor film 103 with the insulating layer 104 and whose abscissa represents the length of the components in the cross-sectional structure in a channel length direction. Note that the center of the channel formation region is the origin of the length X in the channel length direction, and the cross-sectional shape of the insulating layer 104 is a trapezoid whose bottom side is 3 μm.

Figure 20A:
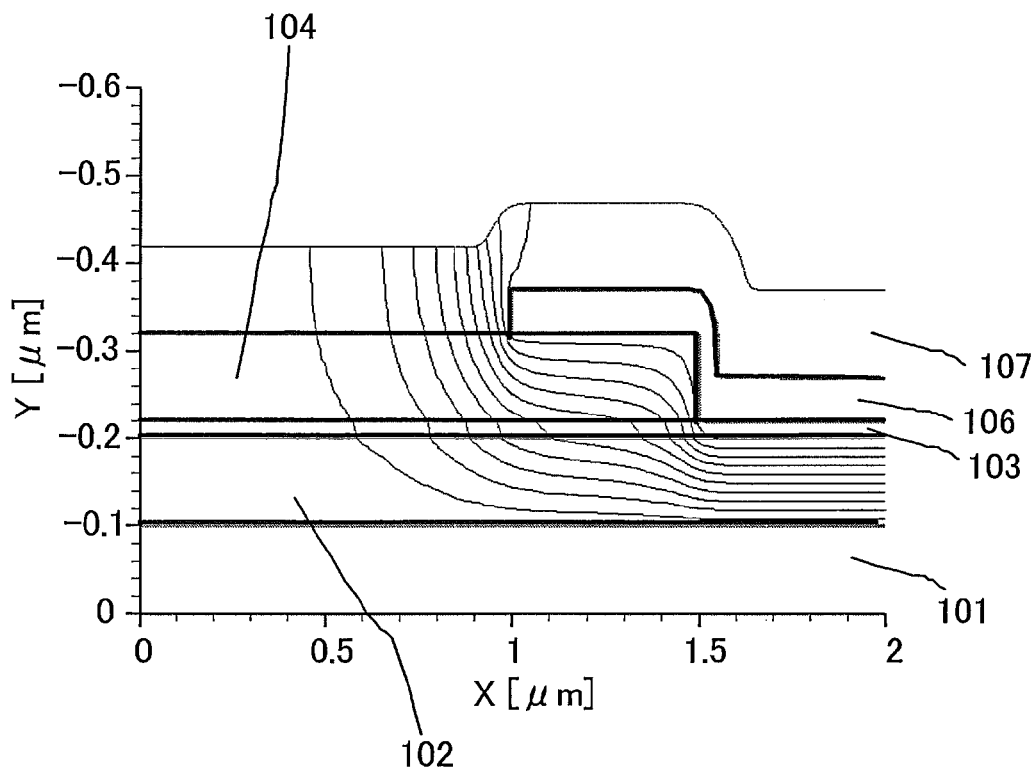
FIGS. 20A and 20B shows calculation results of a comparative example.
Figure 20B:
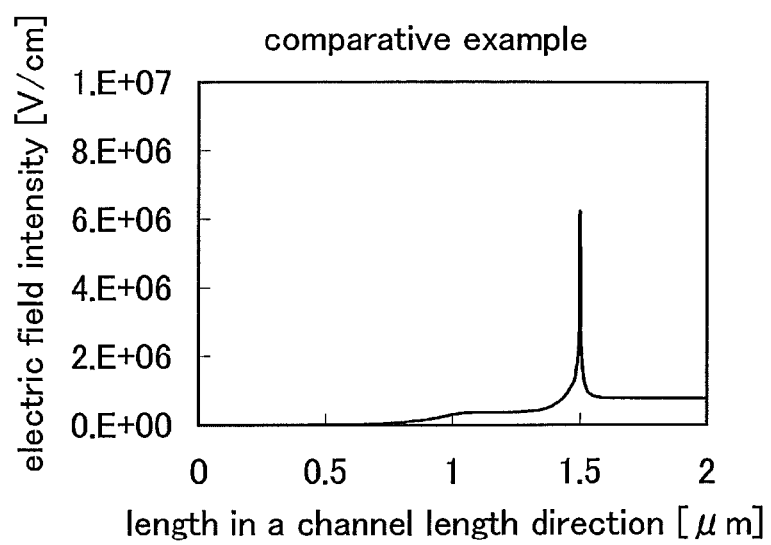

In addition, for comparison, the calculation was performed using a transistor in which the cross-sectional shape of the insulating layer is not a tapered shape, specifically, the cross-sectional shape of the insulating layer is a rectangle (an angle between a side surface of the insulating layer and a principal plane of the substrate is) 90°. FIG. 20A shows equipotential lines in the case where −30 V is applied to the gate electrode layer 101 and potential applied to the drain electrode layer 106 is set to 0 V. FIG. 20B is a graph whose ordinate represents the electric field intensity at the interface of the oxide semiconductor film 103 with the insulating layer 104 and whose abscissa represents a length in a channel length direction. The graph shows that the electric-field concentration occurs in the vicinity of the interface of the oxide semiconductor film with the lower end portion of the insulating layer, i.e., a portion where X=1.5 μm.

The peak of the electric field intensity shown in FIG. 1B is small as compared to the comparative example. This indicates that the electric-field concentration in the tapered insulating layer can be lower than that in the insulating layer whose cross-sectional shape is a rectangle.

Further, the electric field intensity in the case where −30 V is applied to the gate electrode layer 101, 20 V is applied to the drain electrode layer 106, and potential applied to the source electrode layer is set to 0 V was calculated. From the calculation, similar results were obtained.

Figure 2A:
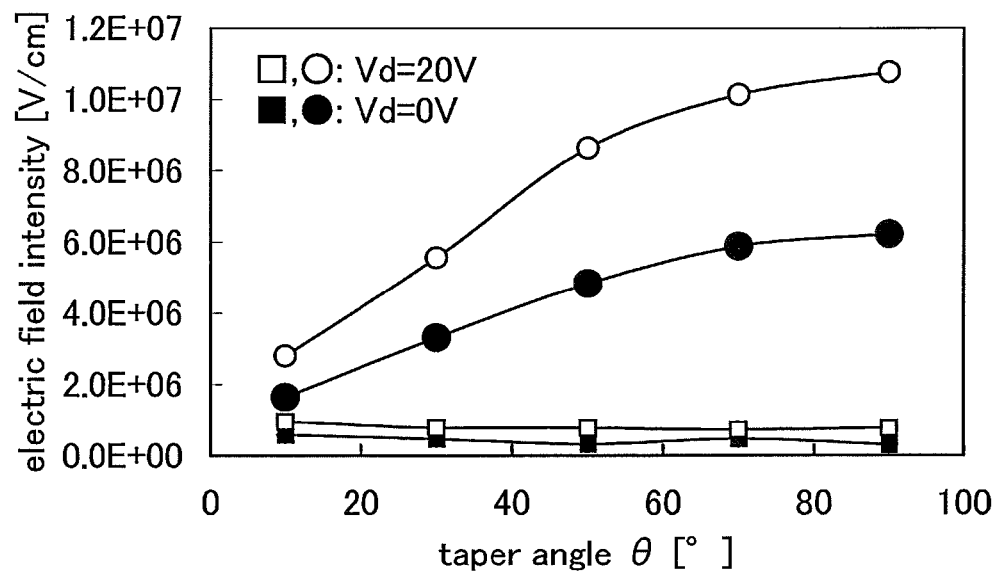
FIGS. 2A and 2B are graphs each showing a relation between a taper angle and the electric field intensity.

FIG. 2A is a graph showing calculation results of the electric field intensity at the interface of the oxide semiconductor film with the insulating layer, the taper angle θ of which is varied among 10°, 30°, 50°, and 70°. Here, the electric field intensities of the portions where X=1.5 μm and X=1.0 μm were calculated. In FIG. 2A, white squares represent the electric field intensities of the portions where X=1.0 μm when 20 V is applied to the drain electrode layer, and white circles represent the electric field intensities of the portions where X=1.5 μm when 20 V is applied to the drain electrode layer. In addition, black squares represent the electric field intensities of the portions where X=1.0 μm when potential applied to the drain electrode layer is set to 0 V, and black circles represent the electric field intensities of the portions where X=1.5 μm when potential applied to the drain electrode layer is set to 0 V.

Figure 2B:
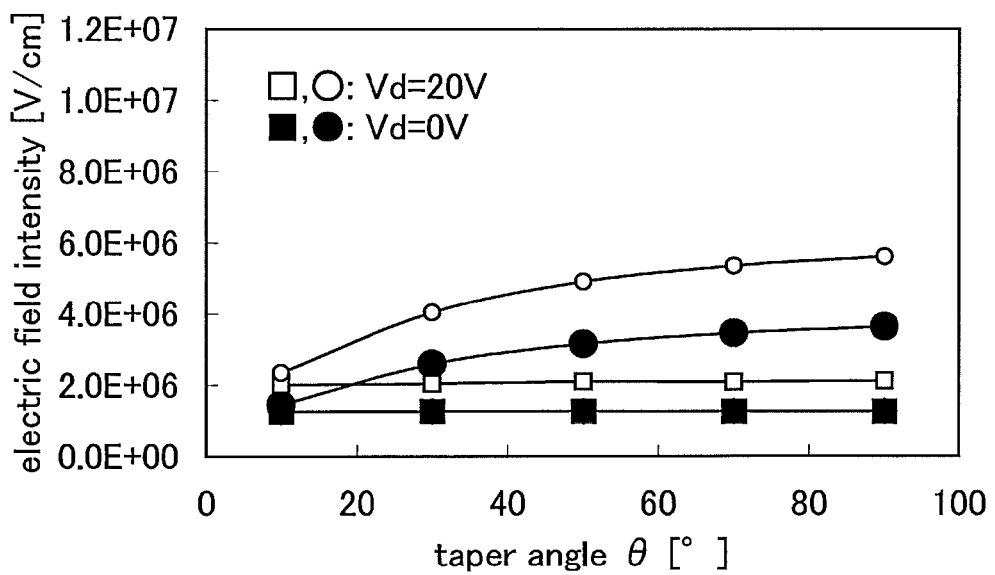

FIG. 2B is a graph showing calculation results of the electric field intensity at the interface of the oxide semiconductor film with the insulating layer (channel stop layer) whose thickness is 20 nm and taper angle θ is varied among 10°, 30°, 50°, and 70°. Here, the electric field intensities of the portions where X=1.5 μm and X=1.0 μm were calculated. In FIG. 2B, white squares represent the electric field intensities of the portions where X=1.0 μm when 20 V is applied to the drain electrode layer, and white circles represent the electric field intensities of the portions where X=1.5 μm when 20 V is applied to the drain electrode layer. In addition, black squares represent the electric field intensities of the portions where X=1.0 μm when potential applied to the drain electrode layer is set to 0 V, and black circles represent the electric field intensities of the portions where X=1.5 μm when potential applied to the drain electrode layer is set to 0 V.

Figure 3A:
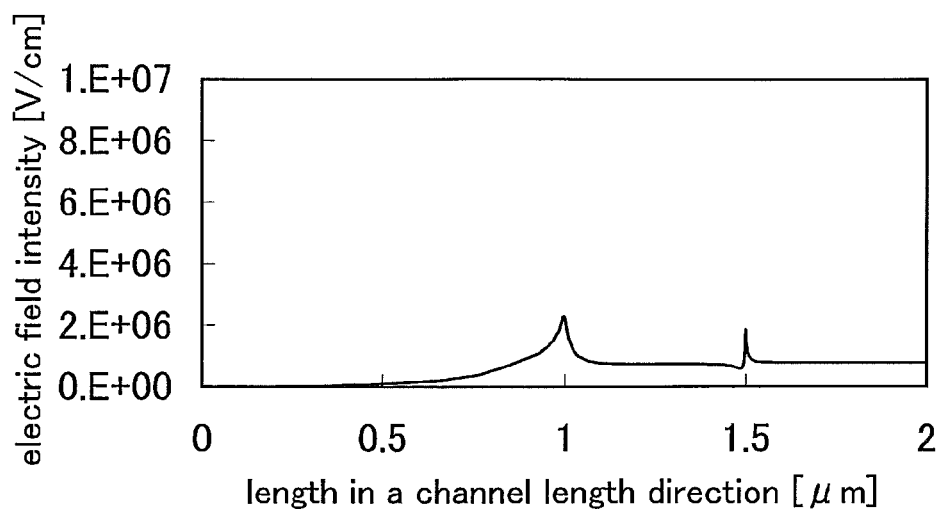
FIG. 3A is a graph showing a relation between the length of an insulating layer in a channel length direction and the electric field intensity and FIG. 3B is a graph showing a relation between the thickness of an insulating layer and the electric field intensity.

Further, equipotential lines in the case where the cross-sectional shape of the insulating layer is a rectangle, the thickness of the insulating layer is 5 nm, −30 V is applied to the gate electrode layer 101, and potential applied to the drain electrode layer 106 is set to 0 V were calculated. Then, the electric field intensity at the interface of the oxide semiconductor film with the insulating layer and the position where the electric-field concentration occurs were examined. FIG. 3A is a graph whose ordinate represents the electric field intensity and whose abscissa represents a length in a channel length direction. Note that the calculation was performed under the same conditions as those of the comparative example, except for the thickness of the insulating layer. The thickness of the insulating layer is 5 nm, which is thinner than that of the comparative example; accordingly, a plurality of peaks of the electric-field concentration, each of which is smaller than that of the comparative example are generated. According to the result, it can be confirmed that the electric-field concentration can also be reduced by reducing the thickness of the insulating layer regardless of the cross-sectional shape of the insulating layer. Needless to say, the electric-field concentration can be further reduced by tapering the cross-sectional shape in addition to reducing the thickness.

Figure 3B:
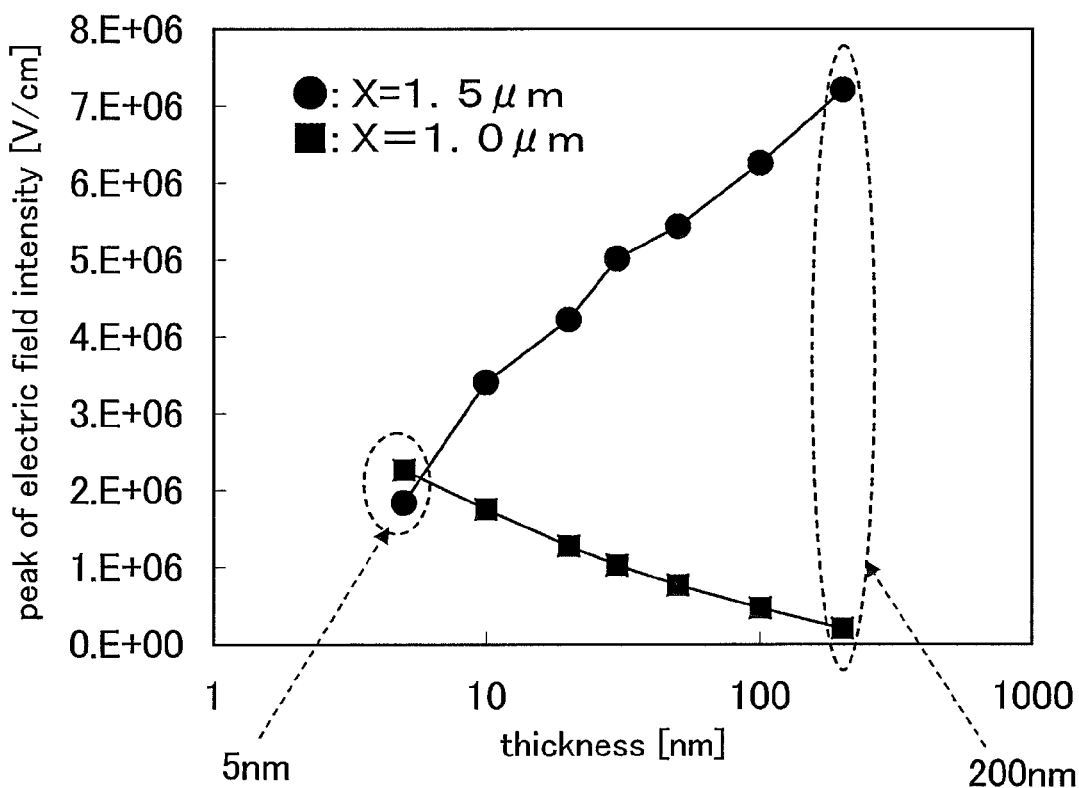

FIG. 3B is a graph showing calculation results of the electric field intensities of the portions where X=1.5 μm and X=1.0 μm, in the case where the cross-sectional shape of the insulating layer is a rectangle, and the thicknesses of the insulating layer is varied among 5 nm, 10 nm, 20 nm, 30 nm, 50 nm, 100 nm, and 200 nm. FIG. 3A is a graph whose ordinate represents the electric field intensity and whose abscissa represents the thickness of the insulating layer. In FIG. 3B, black squares represent the electric field intensities of the portions where X=1.0 μm when potential applied to the drain electrode layer is set to 0 V, and black circles represent the electric field intensities of the portions where X=1.5 μm when potential applied to the drain electrode layer is set to 0 V. The thickness of each of the components in the cross-sectional structure in FIG. 3B is shown with a logarithmic scale. In addition, graphs for respective thicknesses, whose ordinates represent the electric field intensities and whose abscissas represent a length in the channel length direction are constructed. The graphs show that the range of the thickness of the insulating layer where a plurality of peaks of the electric-field concentration are generated is greater than or equal to 5 nm and less than or equal to 50 nm.

From the above calculation results, it is confirmed that the electric-field concentration can be reduced when the cross-sectional shape of the insulating layer is a tapered shape and the thickness of the insulating layer is greater than or equal to 5 nm and less than or equal to 100 nm, preferably greater than or equal to 5 nm and less than or equal to 50 nm. In the case where the taper angle is smaller than or equal to 60°, the electric-field concentration can be reduced even when the thickness of the insulating layer is 300 nm. Accordingly, the electric-field concentration can be reduced when the taper angle of the end portion of the insulating layer is smaller than or equal to 60° and the thickness of the insulating layer is less than or equal to 300 nm.

(Embodiment 2)

In this embodiment, an example of a cross-sectional shape of the insulating layer will be described below.

Figure 4A:
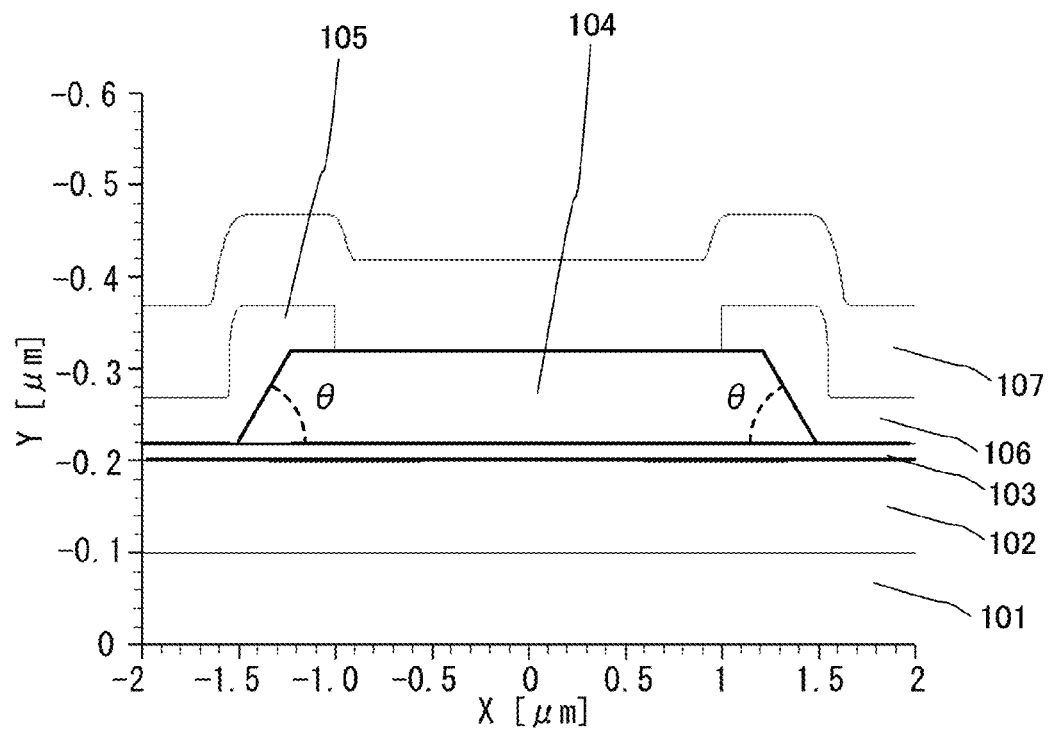
FIGS. 4A to 4E are each an example of a cross-sectional view illustrating one embodiment of the present invention.

While the calculation model used in Embodiment 1 shows the cross-sectional view of the vicinity of the drain electrode layer 106, FIG. 4A shows the cross-sectional structural view of a whole transistor, including a source electrode layer 105.

In FIG. 4A, a surface of the oxide semiconductor film 103, which is in a region where the insulating layer 104 is provided, is flat and can be regarded as being substantially parallel to the principal plane of the substrate; thus, the taper angle θ is, as illustrated in FIG. 4A, an angle between a side surface of the lower end portion of the insulating layer 104 and the flat surface of the oxide semiconductor film. The insulating layer 104 illustrated in FIG. 4A has an axisymmetric shape with respect to a line passing through the center of the channel formation region, so that the taper angles θ of two lower end portions of the cross-sectional shape are substantially the same. A length in a channel length direction is determined using the center of the channel formation region as the zero point of an abscissa. Note that although the sizes (e.g., the thicknesses, the lengths, and the widths) of components are determined in the cross-sectional structure of the transistor illustrated in FIG. 4A, there is no particular limitation on the sizes.

Figure 4B:
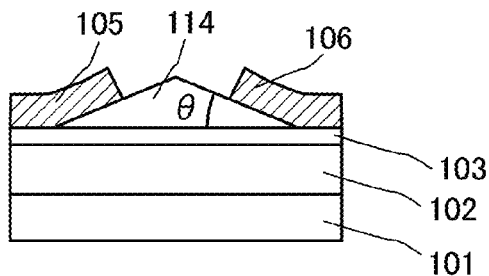

Although FIG. 4A shows an example where the cross-sectional shape of the insulating layer is a trapezoid, an insulating layer 114 whose cross-sectional shape is a triangle as illustrated in FIG. 4B may be used. In the cross-sectional shape of the insulating layer 114, the taper angle θ is an interior angle adjacent to the bottom surface of the triangle. In FIG. 4B, a side surface of the insulating layer 114 overlaps with the end portion of the drain electrode layer. Needless to say, the other side surface of the insulating layer 114 overlaps with the end portion of the source electrode layer.

Figure 4C:
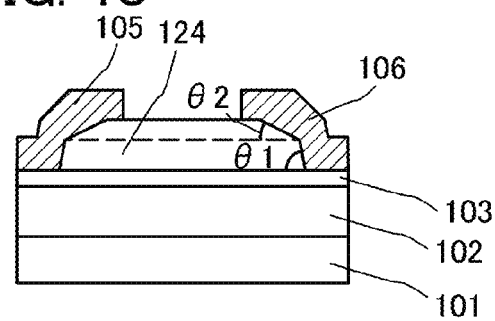

Alternatively, an insulating layer 124 whose cross-sectional shape is a polygon as illustrated in FIG. 4C may be used. As illustrated in FIG. 4C, the cross-sectional shape of the insulating layer 124, which is a polygon, has an angle θ1 between a side surface of a lower end portion of the insulating layer 124 and the flat surface of the oxide semiconductor film, and an angle θ2 between a plane shown by a dotted line (a plane parallel to the principal plane of the substrate) and a side surface of an upper end portion of the insulating layer 104. In that case, at least the angle θ1 of the cross-sectional shape of the insulating layer 124 is smaller than 90°, preferably smaller than or equal to 60°, further preferably smaller than or equal to 30°.

Figure 4D:
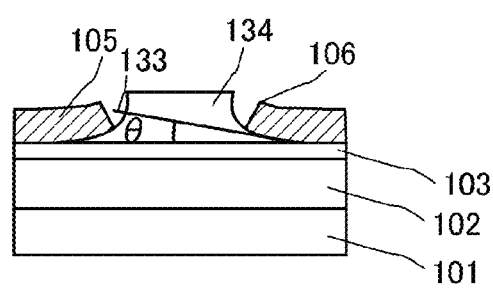

Further alternatively, an insulating layer 134 having a cross-sectional shape whose width is spread from the top surface of the insulating layer toward the bottom surface thereof as illustrated in FIG. 4D may be used. A side surface of the insulating layer 134 has a curved surface and a lower end portion of the insulating layer has one curved surface which is determined by the center of the circle of curvature, which is positioned outside the insulating layer. Note that an angle (taper angle θ) between a plane including a tangent 133 of a side surface, a starting point of which is a lower end of the insulating layer and the flat surface of the oxide semiconductor film is illustrated.

Figure 4E:
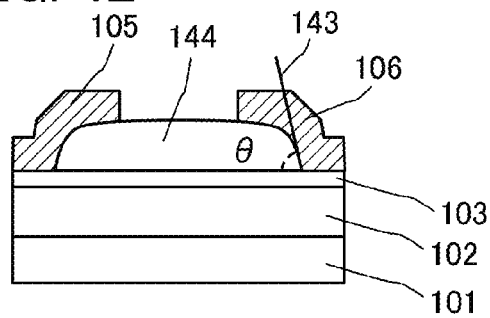

An insulating layer 144 having a cross-sectional shape whose side surface has a curved surface as illustrated in FIG. 4E may also be used. A side surface of the insulating layer 144 has a curved surface and a lower end portion of the insulating layer has one curved surface which is determined by the center of the circle of curvature, which is positioned inside the insulating layer. Note that an angle (taper angle θ) between a plane including a tangent 143 of a side surface, a starting point of which is a lower end of the insulating layer and the flat surface of the oxide semiconductor film is illustrated. To obtain the insulating layer 144 having such a cross-sectional shape, a plurality of insulating layers having different etching rates may be stacked.

Although a variety of cross-sectional shapes other than the above-described cross-sectional shapes can be used, the insulating layer having any one of the shapes illustrated in FIGS. 4A to 4E is preferably used in the transistor. When the insulating layer having any one of the shapes illustrated in FIGS. 4A to 4E is provided to be in contact with the oxide semiconductor film, the electric-field concentration can be reduced.

This embodiment can be freely combined with Embodiment 1. For example, the electric-field concentration can be reduced by employing the following structure: the insulating layer 114 has the cross-sectional shape illustrated in FIG. 4B, the taper angle θ of the end portion is smaller than or equal to 60°, and the thickness of the insulating layer 114 is less than or equal to 300 nm.

(Embodiment 3)

In this embodiment, one embodiment of a semiconductor device and a method for manufacturing the semiconductor device will be described with reference to FIGS. 5A and 5B and FIGS. 6A to 6D. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 5A:
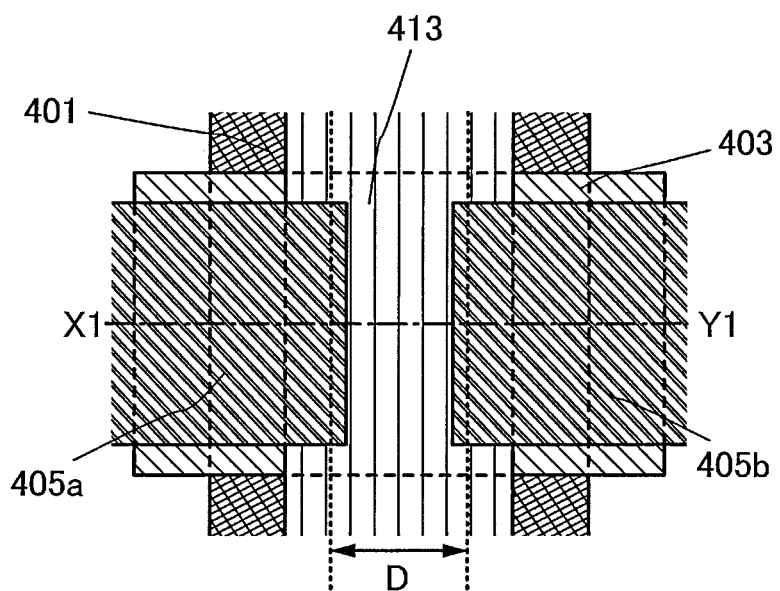
FIGS. 5A and 5B are an example of a top view and an example of a cross-sectional view, illustrating one embodiment of the present invention.
Figure 5B:
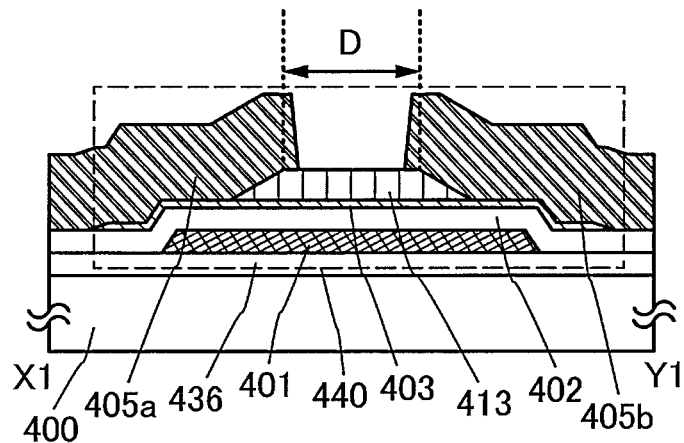

A transistor 440 illustrated in FIGS. 5A and 5B is an example of a transistor which is one of bottom-gate transistors referred to as a channel-protective (channel-stop) transistor and is also referred to as an inverted-staggered transistor. FIG. 5A is a plan view, and FIG. 5B is a cross-sectional view taken along dashed-dotted line X1-Y1 in FIG. 5A.

As illustrated in FIG. 5B, which is a cross-sectional view in the channel length direction, a semiconductor device including the transistor 440 includes, over a substrate 400 having an insulating surface over which an insulating film 436 is provided, a gate electrode layer 401, a gate insulating film 402, an oxide semiconductor film 403, an insulating layer 413, a source electrode layer 405a, and a drain electrode layer 405b.

The insulating layer 413 in contact with the oxide semiconductor film 403 is provided over a channel formation region of the oxide semiconductor film 403, which overlaps with the gate electrode layer 401, and functions as a channel protective film.

The cross-sectional shape of the insulating layer 413 which is over and overlaps with the channel formation region, specifically, the cross-sectional shape (e.g., taper angle θ and thickness) of an end portion of the insulating layer 413 is adjusted, so that electric-field concentration which might occur in the vicinity of an end portion of the drain electrode layer 405b can be reduced and degradation of the switching characteristics of the transistor 440 can be suppressed.

1Specifically, the cross-sectional shape of the insulating layer 413 which is over and overlaps with the channel formation region is set to a trapezoid or a triangle, and the taper angle θ of a lower end portion of the cross-sectional shape is set to 60° or less, preferably 45° or less, further preferably 30° or less. Setting the taper angle within such a range makes it possible to reduce the electric-field concentration which might occur in the vicinity of the end portion of the drain electrode layer 405b when a high gate voltage is applied to the gate electrode layer 401.

In this embodiment, in the cross-sectional shape, the end portion of the insulating layer 413, which is outside a central region D, is tapered and is called a tapered portion. In the cross-sectional shape, both ends of the insulating layer 413 are tapered portions. The width of one of the tapered portions is called "the width of the tapered portion", which corresponds to about half the length obtained by subtracting the central region D from a channel length L.

The thickness of the insulating layer 413 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

An oxide semiconductor used for the oxide semiconductor film 403 preferably contains at least indium (In) or zinc (Zn). In particular, In and Zn are preferably contained. In addition, as a stabilizer for reducing variation in electric characteristics of a transistor formed using the oxide, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an "In—Ga—Zn-based oxide" means an oxide containing In, Ga, and Zn and there is no particular limitation on the ratio of In:Ga:Zn. The In—Ga—Zn-based oxide may contain a metal element other than the In, Ga, and Zn. The In—Ga—Zn-based oxide has sufficiently high resistance when there is no electric field and off-state current can be sufficiently reduced. Further, with high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn =1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, high mobility can be obtained relatively easily in the case of using an In—Sn—Zn-based oxide. However, mobility can be increased by reducing the defect density in a bulk also in the case of using an In—Ga—Zn-based oxide.

Note that a purified oxide semiconductor obtained by reduction of impurities serving as electron donors (donors), such as moisture or hydrogen, and by reduction of oxygen defects is an i-type (intrinsic) semiconductor or a substantially i-type semiconductor. Thus, a transistor including the oxide semiconductor has extremely low off-state current. The band gap of the oxide semiconductor is 2 eV or more, preferably 2.5 eV or more, further preferably 3 eV or more. With the use of an oxide semiconductor film that is highly purified by sufficient decrease in the concentration of impurities such as moisture or hydrogen and reduction of oxygen defects, the off-state current of a transistor can be decreased.

Specifically, a variety of experiments can prove low off-state current of a transistor in which a purified oxide semiconductor is used for a semiconductor film. For example, the off-state current of even a transistor with a channel width of $1\times10^6$ μm and a channel length of 10 μm can be less than or equal to the measurement limit of a semiconductor parameter analyzer, that is, less than or equal to $1\times10^{-13}$ A when the voltage between a source electrode and a drain electrode (drain voltage) ranges from 1 V to 10 V. In that case, the off-state current density corresponding to a value obtained by dividing the off-state current by the channel width of the transistor is 100 zA/μm or less. In addition, the off-state current was measured using a circuit in which a capacitor and a transistor were connected to each other and charge flowing into or from the capacitor was controlled by the transistor. For the measurement, the transistor in which a channel formation region is formed in a purified oxide semiconductor film was used, and the off-state current density of the transistor was measured from a change in the amount of charge of the capacitor per unit time. As a result, it is found that lower off-state current density of several tens of yoctoamperes per micrometer (yA/μm) can be obtained when the voltage between the source electrode and the drain electrode of the transistor is 3 V. Consequently, the off-state current of the transistor in which the channel formation region is formed in the purified oxide semiconductor film is significantly lower than that of a transistor using crystalline silicon.

Unless otherwise specified, in this specification, the off-state current of an n-channel transistor is a current that flows between a source electrode and a drain electrode when the potential of a gate is lower than or equal to 0 with the potential of the source electrode as a reference potential while the potential of the drain electrode is higher than those of the source electrode and the gate. Moreover, in this specification, the off-state current of a p-channel transistor is a current that flows between a source electrode and a drain electrode when the potential of a gate is higher than or equal to 0 with the potential of the source electrode as a reference potential while the potential of the drain electrode is lower than those of the source electrode and the gate.

For example, an oxide semiconductor film can be formed by sputtering using a target including indium (In), gallium (Ga), and zinc (Zn). When an In—Ga—Zn-based oxide semiconductor film is formed by sputtering, it is preferable to use an In—Ga—Zn-based oxide target having an atomic ratio of In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or a c-axis aligned crystal (CAAC) is likely to be formed. The filling rate of the target including In, Ga, and Zn is higher than or equal to 90% and lower than or equal to 100%, preferably higher than or equal to 95% and lower than 100%. With the use of the target with high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, when a target used for forming an oxide semiconductor film containing an In—Zn-based oxide has an atomic ratio of In:Zn:O=X:Y:Z, the relation of Z>1.5X+Y is satisfied. The mobility can be increased by keeping the ratio of Zn within the above range.

The oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

Note that since the transistor 440 described in this embodiment is a bottom-gate transistor, the substrate 400, the gate electrode layer 401, and the gate insulating film 402 are located below the oxide semiconductor film. Accordingly, planarization treatment such as CMP treatment may be performed after the formation of the gate electrode layer 401 and the gate insulating film 402 to obtain the above flat surface. Other than planarizing the entire surface of the components over the substrate, it is also possible to sufficiently increase the distance between a side surface of the gate electrode layer 401 and the lower end portion of the insulating layer 413 so that at least a region which is to be the channel formation region can have a surface as flat as the above flat surface. Since the transistor 440 is a channel-protective transistor, the size (L/W) of the channel formation region is determined by the size of the insulating layer 413.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

FIGS. 6A to 6D illustrate an example of a method for manufacturing the semiconductor device including the transistor 440.

First, the insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a manufacturing substrate, and then may be separated and transferred to a flexible substrate. Note that in order to separate the transistor 440 from the manufacturing substrate and transfer it to the flexible substrate, a separation layer may be provided between the manufacturing substrate and the transistor 440 including the oxide semiconductor film.

The insulating film 436 can be formed by a plasma CVD method, a sputtering method, or the like using an oxide insulating material such as silicon oxide, silicon oxynitride, aluminum oxide, aluminum oxynitride, hafnium oxide, or gallium oxide; a nitride insulating material such as silicon nitride, silicon nitride oxide, aluminum nitride, or aluminum nitride oxide; or a mixed material of any of these materials.

The insulating film 436 may have either a single-layer structure or a stacked-layer structure.

In this embodiment, a stack of a 100-nm-thick silicon nitride film and a 150-nm-thick silicon oxide film, which are formed by a plasma CVD method, is used as the insulating film 436.

Next, a conductive film is formed over the insulating film 436 and etched, whereby the gate electrode layer 401 is formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film typified by a polycrystalline silicon film doped with an impurity element such as phosphorus, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a switching element of what is called normally-off type can be achieved.

In this embodiment, a 100-nm-thick tungsten film is formed by a sputtering method.

Next, the gate insulating film 402 is formed over the gate electrode layer 401.

To improve the coverage with the gate insulating film 402, planarization treatment may be performed on a surface of the gate electrode layer 401. It is preferable that the flatness of the surface of the gate electrode layer 401 be good particularly when the thickness of the gate insulating film 402 is small.

The gate insulating film 402 has a thickness greater than or equal to 1 nm and less than or equal to 20 nm and can be formed by a sputtering method, an MBE method, a CVD method, a pulsed laser deposition method, an ALD method, or the like as appropriate. The gate insulating film 402 may also be formed with a sputtering apparatus which performs deposition in the state where top surfaces of a plurality of substrates are substantially perpendicular to a top surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

The gate insulating film 402 can be formed using a high-k material such as hafnium oxide, yttrium oxide, hafnium silicate ($HfSi_xO_y$, (x>0, y>0)), hafnium silicate to which nitrogen is added ($HfSiO_xN_y$ (x>0, y>0)), hafnium aluminate ($HfAl_xO_y$ (x>0, y >0)), or lanthanum oxide, whereby gate leakage current can be reduced. Further, the gate insulating film 402 may have either a single-layer structure or a stacked-layer structure.

It is preferable that the gate insulating film 402 contain oxygen in a portion in contact with the oxide semiconductor film 403. In particular, the gate insulating film 402 preferably contains a large amount of oxygen which exceeds at least the amount of oxygen in the stoichiometric proportion in the film (bulk). For example, in the case where a silicon oxide film is used as the gate insulating film 402, the composition formula is $SiO_{2+\alpha}$ ($\alpha$>0).

When the gate insulating film 402 containing much (excess) oxygen, which serves as an oxygen supply source, is provided so as to be in contact with the oxide semiconductor film 403, oxygen can be supplied from the gate insulating film 402 to the oxide semiconductor film 403. Heat treatment may be performed in the state where the oxide semiconductor film 403 and the gate insulating film 402 are at least partly in contact with each other to supply oxygen to the oxide semiconductor film 403.

By supply of oxygen to the oxide semiconductor film 403, oxygen vacancies in the film can be repaired. Further, the gate insulating film 402 is preferably formed in consideration of the size of a transistor to be formed and the step coverage with the gate insulating film 402.

In this embodiment, a 200-nm-thick silicon oxynitride film is formed by a high-density plasma CVD method.

Next, the oxide semiconductor film 403 is formed over the gate insulating film 402.

To prevent the oxide semiconductor film 403 from containing hydrogen or water as much as possible in the step of forming the oxide semiconductor film 403, it is preferable to heat the substrate provided with the gate insulating film 402 in a preheating chamber in a sputtering apparatus as a pretreatment for formation of the oxide semiconductor film 403 so that impurities such as hydrogen and moisture adsorbed on the substrate and the gate insulating film 402 are eliminated and removed. As an exhaustion unit provided in the preheating chamber, a cryopump is preferable.

Planarization treatment may be performed on a region of the gate insulating film 402 which is to be in contact with the oxide semiconductor film 403. The planarization treatment may be, but not particularly limited to, a polishing treatment (such as chemical mechanical polishing (CMP)), a dry etching treatment, or a plasma treatment.

As plasma treatment, reverse sputtering in which an argon gas is introduced and plasma is generated can be performed, for example. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface of the gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 402.

The oxide semiconductor film 403 is preferably formed under a condition that much oxygen is contained (for example, by a sputtering method in an atmosphere where the proportion of oxygen is 100%) so as to be a film containing much oxygen (preferably having a region where the oxygen content is in excess of that in the stoichiometric composition of the oxide semiconductor in a crystalline state).

In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. The deposition conditions are as follows: the atmosphere is oxygen and argon (the proportion of the oxygen flow rate is 50%), the pressure is 0.6 Pa, the electric power is 5 kW, and the substrate temperature is 170° C. The deposition rate under these deposition conditions is 16 nm/min.

In the sputtering apparatus used for depositing the oxide semiconductor film 403, the leakage rate of a deposition treatment chamber is set to less than or equal to $1\times10^{-10}$ Pa·m$^3$/s. Owing to the low leakage rate of the deposition treatment chamber, the amount of impurities entering the film to be formed by a sputtering method can be reduced. To decrease the leakage rate of the deposition treatment chamber, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. An open/close portion of the deposition treatment chamber of the sputtering apparatus used for deposition of the oxide semiconductor film 403 is sealed with a metal gasket. For the metal gasket, a metal material covered with iron fluoride, aluminum oxide, or chromium oxide is preferably used. The metal gasket enables higher adhesion than an O-ring, leading to a reduction in the external leakage. An adsorbate present at the inner wall of the deposition treatment chamber does not affect the pressure in the deposition chamber because it is adsorbed on the inner wall, but the adsorbate leads to release of a gas at the time of the evacuation of the deposition treatment chamber. Thus, although the leakage rate and the evacuation rate do not have a correlation, it is important that the adsorbate present in the deposition treatment chamber be removed as much as possible and evacuation be performed in advance with the use of a pump having high evacuation capability. Note that the deposition treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

It is preferable that a high-purity gas in which impurities such as hydrogen, water, a hydroxyl group, and hydride are reduced be used as a sputtering gas for the formation of the oxide semiconductor film 403.

The substrate is held in a deposition chamber kept under reduced pressure. Then, a sputtering gas from which hydrogen and moisture have been removed is introduced into the deposition chamber while moisture remaining therein is removed, and the oxide semiconductor film 403 is formed over the substrate 400 with the use of the above target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. From the deposition chamber which is evacuated with the cryopump, for example, a hydrogen atom, a compound containing a hydrogen atom, such as water (H$_2$O), (further preferably, also a compound containing a carbon atom), and the like are removed, whereby the concentration of impurities in the oxide semiconductor film 403 formed in the deposition chamber can be reduced.

It is preferable to form the gate insulating film 402 and the oxide semiconductor film 403 in succession without exposure to the air. Forming the gate insulating film 402 and the oxide semiconductor film 403 in succession without exposure to the air can prevent impurities such as hydrogen and moisture from being adsorbed onto the surface of the gate insulating film 402.

The oxide semiconductor film 403 can be formed by processing an oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. It is also possible to employ dry etching by an inductively coupled plasma (ICP) etching method.

Further, heat treatment may be performed on the oxide semiconductor film 403 to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

In this embodiment, the substrate is introduced into an electric furnace which is one of heat treatment apparatuses, and the oxide semiconductor film 403 is subjected to heat treatment at 450° C. in a nitrogen atmosphere for one hour and further to heat treatment at 450° C. in an atmosphere containing nitrogen and oxygen for one hour.

Note that a heat treatment apparatus used is not limited to an electric furnace, and a device for heating an object to be processed by heat conduction or heat radiation from a heating element such as a resistance heating element may be alternatively used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperatures of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration of the oxygen gas or the dinitrogen monoxide gas is preferably 1 ppm or lower, further preferably 0.1 ppm or lower). The oxygen gas or the dinitrogen monoxide gas acts to supply oxygen that is a main component material of the oxide semiconductor and that is reduced by the step for removing an impurity for dehydration or dehydrogenation, so that the oxide semiconductor film 403 can be a high-purified, i-type (intrinsic) oxide semiconductor film.

Note that the timing of the heat treatment for dehydration or dehydrogenation may be after formation of the oxide semiconductor film or after formation of the island-shaped oxide semiconductor film 403.

The heat treatment for dehydration or dehydrogenation may be performed plural times and may also serve as another heat treatment.

When the heat treatment for dehydration or dehydrogenation is performed in the state where the gate insulating film 402 is covered with the film-shaped oxide semiconductor film which has not been processed into the island-shaped oxide semiconductor film 403, oxygen contained in the gate insulating film 402 can be prevented from being released by the heat treatment, which is preferable.

Further or alternatively, oxygen (which includes at least one of an oxygen radical, an oxygen atom, and an oxygen ion) may be introduced into the oxide semiconductor film 403 after being subjected to the dehydration or dehydrogenation treatment to supply oxygen to the oxide semiconductor film 403.

The dehydration or dehydrogenation treatment may accompany elimination of oxygen which is a main component material of an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Oxygen which is introduced into the dehydrated or dehydrogenated oxide semiconductor film 403 to supply oxygen to the film can highly purify the oxide semiconductor film 403 and make the film an i-type (intrinsic). Variation in electric characteristics of a transistor having a highly-purified and i-type (intrinsic) oxide semiconductor film 403 is suppressed, and the transistor is electrically stable.

Oxygen can be introduced by an ion implantation method, an ion doping method, a plasma immersion ion implantation method, plasma treatment, or the like.

In the case where oxygen is introduced into the oxide semiconductor film 403, oxygen may be directly introduced into the oxide semiconductor film 403, or may be introduced into the oxide semiconductor film 403 through another film such as the gate insulating film 402. An ion implantation method, an ion doping method, a plasma immersion ion implantation method, or the like may be employed for the introduction of oxygen through another film, whereas plasma treatment or the like can also be employed for the introduction of oxygen directly into the oxide semiconductor film 403 in the state where the oxide semiconductor film 403 is exposed.

The introduction of oxygen to the oxide semiconductor film 403 is preferably performed after dehydration or dehydrogenation treatment is performed thereon, but the timing is not limited thereto. Further, oxygen may be introduced plural times into the oxide semiconductor film 403 subjected to the dehydration or dehydrogenation treatment.

Figure 6A:
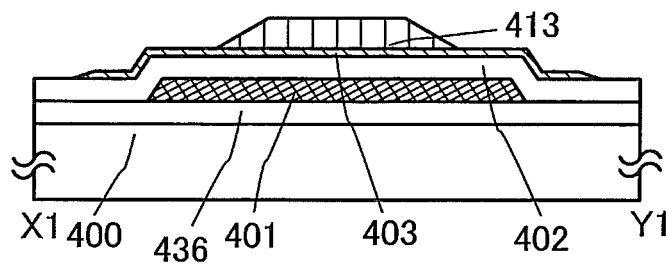
FIGS. 6A to 6D are cross-sectional views illustrating an example of a process of one embodiment of the present invention.

Next, the insulating layer 413 is formed over the channel formation region of the oxide semiconductor film 403, which overlaps with the gate electrode layer 401 (see FIG. 6A).

The insulating layer 413 can be formed by etching an insulating film which is formed by a plasma CVD method or a sputtering method. As the insulating layer 413, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

When the insulating layer 413 in contact with the oxide semiconductor film 403 (or a film in contact with the oxide semiconductor film 403 in the case where the insulating layer 413 has a stacked-layer structure) contains much oxygen, the insulating layer 413 (or the film in contact with the oxide semiconductor film 403) can favorably function as a supply source which supplies oxygen to the oxide semiconductor film 403.

In this embodiment, a 200-nm-thick silicon oxide film is formed by a sputtering method as the insulating layer 413. The silicon oxide film is selectively etched to form the insulating layer 413 having a trapezoidal or triangular cross-sectional shape whose taper angle θ at the lower end portion is 60° or less, preferably 45° or less, further preferably 30° or less. The planar shape of the insulating layer 413 is a rectangle. In this embodiment, a resist mask is formed over the silicon oxide film through a photolithography process, and selective etching is performed, so that the insulating layer 413 whose cross-sectional shape is a trapezoid and whose taper angle θ at the lower end portion is about 30° is formed.

Heat treatment may be performed after the insulating layer 413 is formed. In this embodiment, the heat treatment is performed at 300° C. in a nitrogen atmosphere for one hour.

Figure 6B:
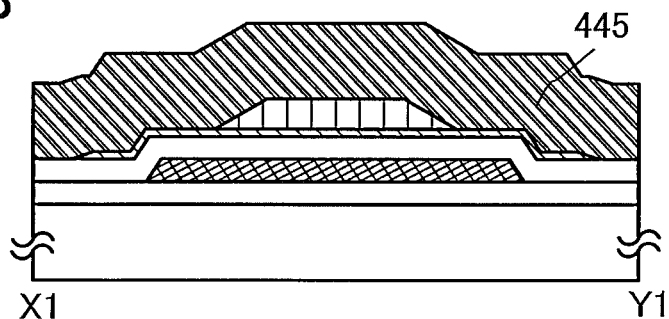

Next, a conductive film 445 for forming a source electrode layer and a drain electrode layer (including a wiring formed of the same layer as the source electrode layer and the drain electrode layer) is formed over the gate electrode layer 401, the gate insulating film 402, the oxide semiconductor film 403, and the insulating layer 413 (see FIG. 6B).

The conductive film 445 is formed using a material that can withstand heat treatment in a later step. As the conductive film 445 used for forming the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (a titanium nitride film, a molybdenum nitride film, or a tungsten nitride film) may be formed over or/and below a metal film such as an Al film or a Cu film. Further alternatively, the conductive film 445 used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials in which silicon oxide is contained can be used.

Figure 6C:
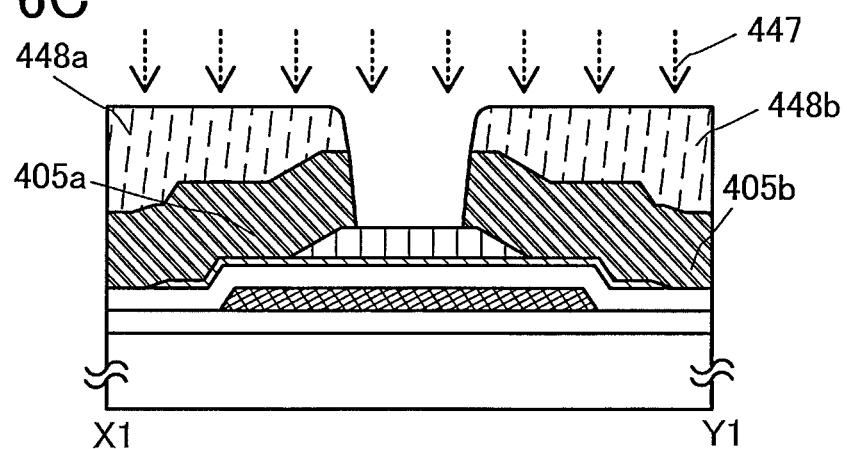

Through a photolithography process, resist masks 448a and 448b are formed over the conductive film 445 and selective etching is performed, so that the source electrode layer 405a and the drain electrode layer 405b are formed (see FIG. 6C). After formation of the source electrode layer 405a and the drain electrode layer 405b, the resist masks are removed. Consequently, an end portion of the drain electrode layer 405b and an end portion of the source electrode layer 405a are each located on a top surface or a side surface of the insulating layer 413.

A gas 447 containing chlorine is used for the etching of the conductive film 445. As the gas 447 containing chlorine, for example, a gas containing chlorine ($Cl_2$), boron trichloride ($BCl_3$), silicon tetrachloride ($SiCl_4$), carbon tetrachloride ($CCl_4$), or the like can be used.

As the etching method, a parallel-plate reactive ion etching (RIE) method or an inductively coupled plasma (ICP) etching method can be used. To etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, a stack of a 100-nm-thick titanium film, a 400-nm-thick aluminum film, and a 100-nm-thick titanium film, which are formed by a sputtering method, is used as the conductive film 445. As the etching of the conductive film 445, the stack of the titanium film, the aluminum film, and the titanium film is etched by dry etching, whereby the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: an etching gas ($BCl_3$:$Cl_2$=750 sccm:150 sccm) is used, the bias power is 1500 W, the ICP power is 0 W, and the pressure is 2.0 Pa. The second etching conditions are as follows: an etching gas ($BCl_3$:$Cl_2$=700 sccm:100 sccm) is used, the bias power is 750 W, the ICP power is 0 W, and the pressure is 2.0 Pa.

As described above, the gas 447 containing chlorine is used in the etching step for forming the source electrode layer 405a and the drain electrode layer 405b. However, when the oxide semiconductor film 403 is exposed to the gas 447 containing chlorine, reaction might occur therebetween to generate a residue on the surface of the insulating layer 413 and in the vicinity thereof between the source electrode layer 405a and the drain electrode layer 405b. The residue between the source electrode layer 405a and the drain electrode layer 405b causes degradation of electric characteristics of the transistor 440, such as leakage current. Further, chlorine contained in the gas (in some cases, also an element other than chlorine contained in the gas) might enter or be attached to the oxide semiconductor film 403 to adversely affect transistor characteristics.

The residue includes, for example, a compound containing indium or chlorine. The residue may further include a metal element other than indium contained in the oxide semiconductor film (e.g., gallium or zinc) or an element other than chlorine used in the gas containing chlorine (e.g., boron).

Thus, after the formation of the source electrode layer 405a and the drain electrode layer 405b, a step of removing the residue on the surface of the insulating layer 413 and in the vicinity thereof between the source electrode layer 405a and the drain electrode layer 405b is performed. The step of removing the residue can be performed by plasma treatment using a rare gas, or the like. For example, plasma treatment using argon or the like can be suitably used. Note that the step of removing the residue also has an effect of removing chlorine which has been attached to the oxide semiconductor film 403. By the step of removing the residue, the chlorine concentration and the indium concentration on the surface of the insulating layer 413 can be lower than or equal to $1\times10^{19}$/$cm^3$ (preferably lower than or equal to $5\times10^{18}$/$cm^3$) and lower than or equal to $2\times10^{19}$/$cm^3$ (preferably lower than or equal to $5\times10^{18}$/$cm^3$), respectively. Further, the chlorine concentration in the oxide semiconductor film 403 can be lower than or equal to $1\times10^{19}$/$cm^3$.

Figure 6D:
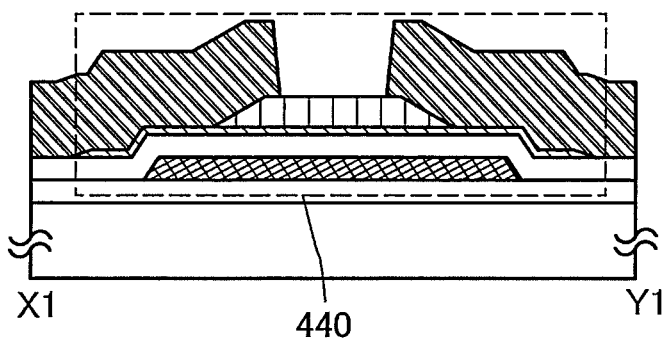

Through the above process, the transistor 440 of this embodiment can be manufactured (see FIG. 6D).

An insulating film serving as a protective insulating film may be formed over the source electrode layer 405a and the drain electrode layer 405b.

The protective insulating film can be formed using a material and a method similar to those of the insulating layer 413. For example, a 400-nm-thick silicon oxynitride film is formed by a CVD method. Heat treatment may be performed after formation of the protective insulating film. For example, heat treatment is performed at 300° C. for one hour in a nitrogen atmosphere.

In addition, a dense inorganic insulating film may be provided as the protective insulating film. For example, as the protective insulating film, an aluminum oxide film is formed by a sputtering method. Providing an aluminum oxide film having high density (film density: 3.2 g/$cm^3$ or higher, preferably 3.6 g/$cm^3$ or higher) can stabilize the electric characteristics of the transistor 440. The film density can be measured by Rutherford backscattering spectrometry (RBS) or X-ray reflection (XRR).

An aluminum oxide film which can be used as the protective insulating film provided over the transistor 440 has a high shielding effect (blocking effect) of preventing penetration of both oxygen and an impurity such as hydrogen or moisture.

Thus, in and after the manufacturing process, the aluminum oxide film functions as a protective film for preventing entry of an impurity such as hydrogen or moisture, which causes a change, into the oxide semiconductor film 403 and release of oxygen, which is a main component material of the oxide semiconductor, from the oxide semiconductor film 403. This is why the aluminum oxide film is preferred to be used.

In addition, a planarization insulating film may be formed in order to reduce surface unevenness due to the transistor 440. As the planarization insulating film, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed using any of these materials.

For example, a 1500-nm-thick acrylic resin film may be formed as the planarization insulating film. The acrylic resin film can be formed in such a manner that an acrylic resin is applied by a coating method and then baked (e.g., at 250° C. for one hour in a nitrogen atmosphere).

Heat treatment may be performed after the planarization insulating film is formed. For example, heat treatment is performed at 250° C. for one hour in a nitrogen atmosphere.

As described above, heat treatment may be performed after formation of the transistor 440. Heat treatment may be performed more than once.

As described above, the insulating layer 413 whose cross-sectional shape is a trapezoid or a triangle and which has the lower end portion with the taper angle θ of less than or equal to 60°, preferably less than or equal to 45°, further preferably less than or equal to 30° is formed, and the end portion of the drain electrode layer and the end portion of the source electrode layer are formed over a region where the insulating layer 413 which overlaps with the channel formation region; thus, the transistor 440 in which the electric-field concentration is reduced is manufactured.

Consequently, a highly reliable semiconductor device which includes the transistor 440 including the oxide semiconductor film 403 and having stable electric characteristics can be provided. Further, the highly reliable semiconductor device can be manufactured at a high yield, whereby high productivity is achieved.

Figure 7A:
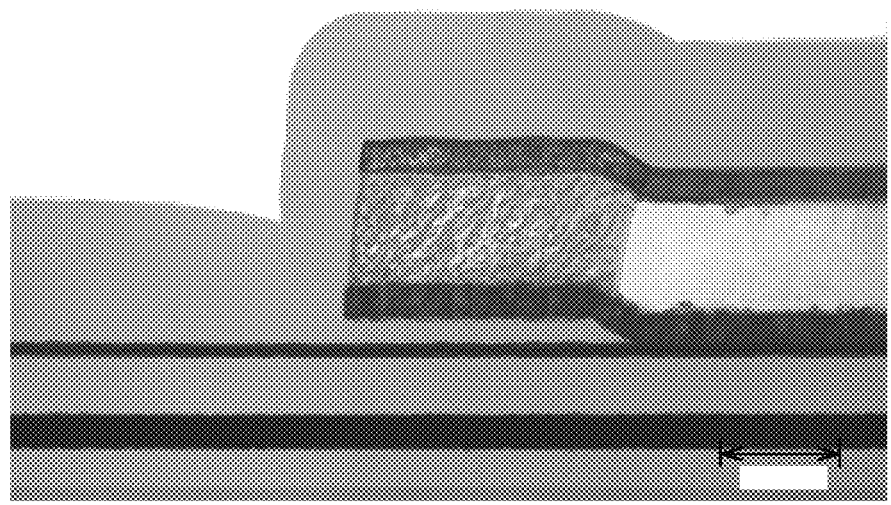
FIGS. 7A and 7B are a STEM image and a schematic view thereof.
Figure 7B:
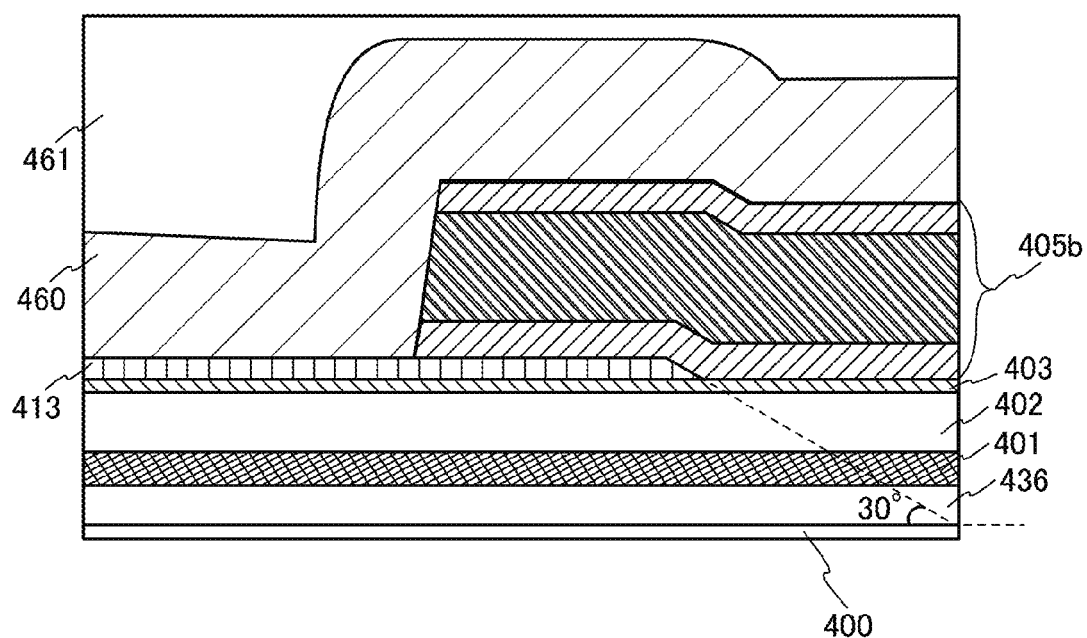

A cross-sectional photograph of a sample is taken in which the transistor 440 is manufactured in accordance with the above manufacturing method; a protective insulating film 460, which is a silicon oxynitride film having a thickness of 400 nm, is formed; and an acrylic resin film having a thickness of 1500 nm is formed as a planarization insulating film 461 over the protective insulating film. FIG. 7A is a high-magnification photograph (magnified 40000 times) of the periphery of the lower end portion of the insulating layer 413 which overlaps with the channel formation region (the lower end portion which overlaps with the drain electrode layer 405b), observed with a scanning transmission electron microscope (STEM: "HD-2300" manufactured by Hitachi, Ltd.) at an acceleration voltage of 200 kV. Note that FIG. 7B is a schematic view of FIG. 7A. As shown in FIG. 7A, an angle between a principal plane of the substrate and the side surface of the insulating layer 413, i.e., the taper angle θ is approximately 30°.

(Embodiment 4)

In this embodiment, another embodiment of a semiconductor device and a method for manufacturing the semiconductor device will be described with reference to FIGS. 8A and 8B and FIGS. 9A to 9D. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 8A:
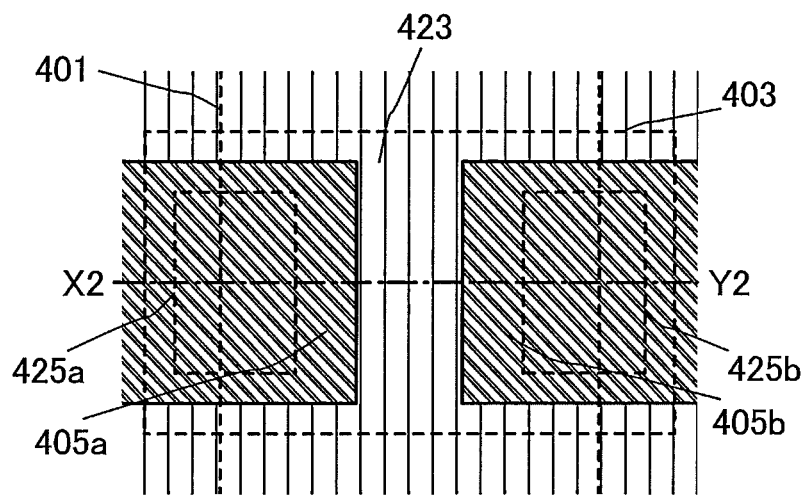
FIGS. 8A and 8B are an example of a cross-sectional view and an example of a top view, illustrating one embodiment of the present invention.
Figure 8B:
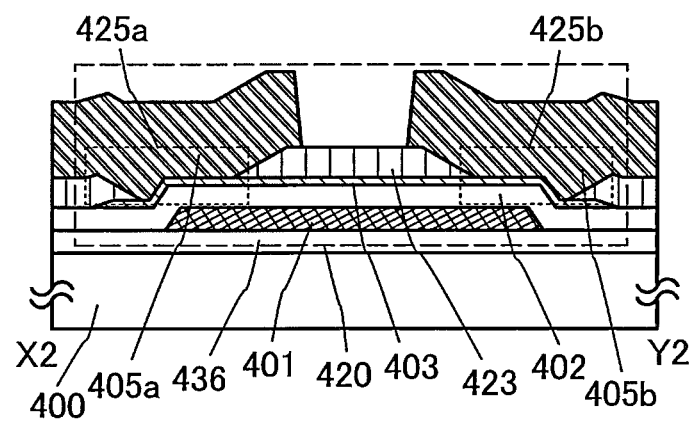

A transistor 420 illustrated in FIGS. 8A and 8B is an example of a transistor which is one of bottom-gate transistors referred to as a channel-protective (channel-stop) transistor and is also referred to as an inverted-staggered transistor. FIG. 8A is a plan view, and FIG. 8B is a cross-sectional view taken along dashed-dotted line X2-Y2 in FIG. 8A.

As illustrated in FIG. 8B, which is a cross-sectional view in the channel length direction, a semiconductor device including the transistor 420 includes, over the substrate 400 having an insulating surface over which the insulating film 436 is provided, the gate electrode layer 401, the gate insulating film 402, the oxide semiconductor film 403, an insulating layer 423, the source electrode layer 405a, and the drain electrode layer 405b.

The insulating layer 423 is provided over a region of the oxide semiconductor film 403 including at least the channel formation region of the oxide semiconductor film 403, which overlaps with the gate electrode layer 401, and functions as a channel protective film. The insulating layer 423 includes an opening which reaches the oxide semiconductor film 403 and whose inner wall is covered with the source electrode layer 405a or the drain electrode layer 405b. Accordingly, the insulating layer 423 covers the periphery of the oxide semiconductor film 403, thus functioning also as an interlayer insulating film. Parasitic capacitance can be reduced by locating, in addition to the gate insulating film 402, the insulating layer 423 as an interlayer insulating film at the intersection of a gate wiring and a source wiring.

In the transistor 420, the oxide semiconductor film 403 is covered with the insulating layer 423, the source electrode layer 405a, and the drain electrode layer 405b.

The cross-sectional shape of the insulating layer 423 which is over and overlaps with the channel formation region, specifically, the cross-sectional shape (e.g., taper angle θ and thickness) of an end portion of the insulating layer 423 is adjusted, so that electric-field concentration which might occur in the vicinity of the end portion of the drain electrode layer 405b can be reduced and degradation of the switching characteristics of the transistor 420 can be suppressed.

Specifically, the cross-sectional shape of the insulating layer 423 which is over and overlaps with the channel formation region is set to a trapezoid or a triangle, and the taper angle θ of a lower end portion of the cross-sectional shape is set to 60° or less, preferably 45° or less, further preferably 30° or less. Setting the taper angle within such a range makes it possible to reduce the electric-field concentration which might occur in the vicinity of the end portion of the drain electrode layer 405b when a high gate voltage is applied to the gate electrode layer 401.

The thickness of the insulating layer 423 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

FIGS. 9A to 9D illustrate an example of a method for manufacturing the semiconductor device including the transistor 420.

The insulating film 436 is formed over the substrate 400 having an insulating surface. In this embodiment, a stack of a 100-nm-thick silicon nitride film and a 150-nm-thick silicon oxide film, which are formed by a plasma CVD method, is used as the insulating film 436.

A conductive film is formed over the insulating film 436 and etched, whereby the gate electrode layer 401 is formed. In this embodiment, a 100-nm-thick tungsten film is formed by a sputtering method.

The gate insulating film 402 is formed over the gate electrode layer 401. In this embodiment, a 200-nm-thick silicon oxynitride film is formed by a high-density plasma CVD method.

The oxide semiconductor film 403 is formed over the gate insulating film 402.

In this embodiment, a 35-nm-thick In—Ga—Zn-based oxide film (IGZO film) is formed as the oxide semiconductor film 403 by a sputtering method. The deposition conditions are as follows: the atmosphere is oxygen and argon (the proportion of the oxygen flow rate is 50%), the pressure is 0.6 Pa, the electric power is 5 kW, and the substrate temperature is 170° C.

Heat treatment may be performed on the oxide semiconductor film 403 to remove excess hydrogen (including water and a hydroxyl group) (to perform dehydration or dehydrogenation treatment). In this embodiment, the substrate is introduced into an electric furnace which is one of heat treatment apparatuses, and the oxide semiconductor film 403 is subjected to heat treatment at 450° C. in a nitrogen atmosphere for one hour and further to heat treatment at 450° C. in an atmosphere containing nitrogen and oxygen for one hour.

Figure 9A:
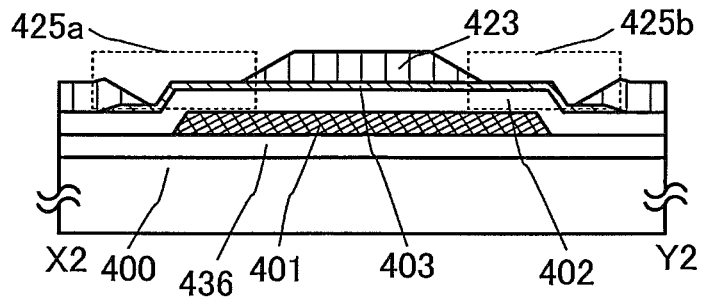
FIGS. 9A to 9D are cross-sectional views illustrating an example of a process of one embodiment of the present invention.

Next, the insulating layer 423 having openings 425a and 425b which reach the oxide semiconductor film 403 is formed over the oxide semiconductor film 403 (see FIG. 9A).

The insulating layer 423 can be formed by etching an insulating film which is formed by a plasma CVD method or a sputtering method. Inner walls of the openings 425a and 425b in the insulating layer 423 are tapered.

The insulating layer 423 is provided over a region of the oxide semiconductor film 403 including at least the channel formation region of the oxide semiconductor film 403, which overlaps with the gate electrode layer 401, and partly functions as a channel protective film.

In this embodiment, the channel formation region of the oxide semiconductor film 403 is covered with the insulating layer 423. An end portion of the oxide semiconductor film 403 is also covered with the insulating layer 423.

In this embodiment, a 200-nm-thick silicon oxide film is formed by a sputtering method as the insulating layer 423. In this embodiment, the taper angle θ of the lower end portion is set to 30° in the cross section of the insulating layer 423.

Heat treatment may be performed after the insulating layer 423 is formed. In this embodiment, heat treatment is performed at 300° C. in a nitrogen atmosphere for one hour.

Figure 9B:
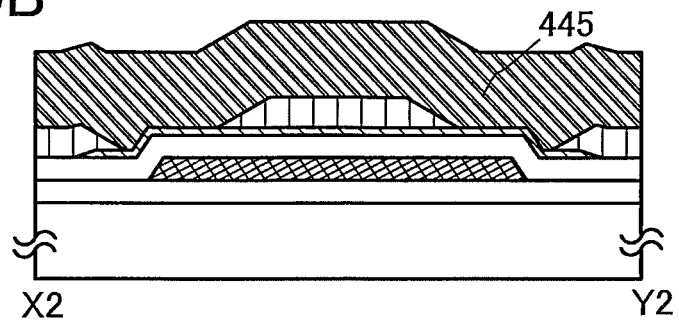

Next, the conductive film 445 for forming the source electrode layer and the drain electrode layer (including a wiring formed of the same layer as the source electrode layer and the drain electrode layer) is formed so as to cover the oxide semiconductor film 403, the insulating layer 423, and the inner walls of the openings 425a and 425b (see FIG. 9B).

Figure 9C:
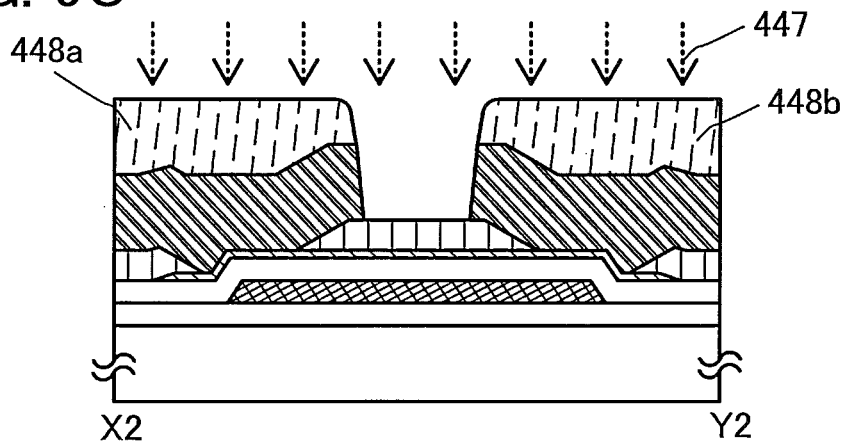

Through a photolithography process, the resist masks 448a and 448b are formed over the conductive film 445 and selective etching is performed, so that the source electrode layer 405a and the drain electrode layer 405b are formed (see FIG. 9C). After formation of the source electrode layer 405a and the drain electrode layer 405b, the resist masks are removed.

The gas 447 containing chlorine is used for the etching of the conductive film 445. As the gas 447 containing chlorine, for example, a gas containing chlorine ($Cl_2$), boron trichloride ($BCl_3$), silicon tetrachloride ($SiCl_4$), carbon tetrachloride ($CCl_4$), or the like can be used.

As the etching method, a parallel-plate reactive ion etching (RIE) method or an inductively coupled plasma (ICP) etching method can be used. To etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, a stack of a 100-nm-thick titanium film, a 400-nm-thick aluminum film, and a 100-nm-thick titanium film, which are formed by a sputtering method, is used as the conductive film 445. As the etching of the conductive film 445, the stack of the titanium film, the aluminum film, and the titanium film is etched by dry etching, whereby the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: an etching gas ($BCl_3$:$Cl_2$=750 sccm:150 sccm) is used, the bias power is 1500 W, the ICP power is 0 W, and the pressure is 2.0 Pa. The second etching conditions are as follows: an etching gas ($BCl_3$:$Cl_2$=700 sccm:100 sccm) is used, the bias power is 750 W, the ICP power is 0 W, and the pressure is 2.0 Pa.

As described above, the gas 447 containing chlorine is used in the etching step for forming the source electrode layer 405a and the drain electrode layer 405b. However, when the oxide semiconductor film 403 is exposed to the gas 447 containing chlorine, reaction might occurs therebetween to generate a residue on the surface of the insulating layer 423 and in the vicinity thereof between the source electrode layer 405a and the drain electrode layer 405b. The residue between the source electrode layer 405a and the drain electrode layer 405b causes degradation of electric characteristics of the transistor 420, such as leakage current. Further, chlorine contained in the gas (in some cases, also an element other than chlorine contained in the gas) might enter or be attached to the oxide semiconductor film 403 to adversely affect transistor characteristics.

In this embodiment, the oxide semiconductor film 403 is not exposed to the gas 447 containing chlorine in the etching step using the gas 447 containing chlorine, because the conductive film 445 is provided so as to cover the insulating layer 423 and the inner walls of the openings 425a and 425b.

Figure 9D:
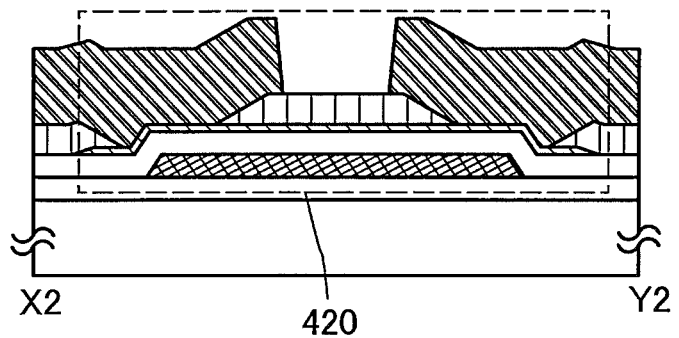

Through the above process, the transistor 420 of this embodiment can be manufactured (see FIG. 9D).

An insulating film serving as a protective insulating film may be formed over the source electrode layer 405a and the drain electrode layer 405b.

The protective insulating film can be formed using a material and a method similar to those of the insulating layer 423. For example, a 400-nm-thick silicon oxynitride film is formed by a CVD method. Heat treatment may be performed after formation of the protective insulating film. For example, heat treatment is performed at 300° C. for one hour in a nitrogen atmosphere.

In addition, a planarization insulating film may be formed in order to reduce surface unevenness due to the transistor 420.

For example, a 1500-nm-thick acrylic resin film may be formed as the planarization insulating film over the protective insulating film. The acrylic resin film can be formed in such a manner that an acrylic resin is applied by a coating method and then baked (e.g., at 250° C. for one hour in a nitrogen atmosphere).

Heat treatment may be performed after the planarization insulating film is formed. For example, heat treatment is performed at 250° C. for one hour in a nitrogen atmosphere.

As described above, the insulating layer 423 whose part (region which overlaps with the channel formation region)

of the cross-sectional shape is a trapezoid and which has the lower end portion with the taper angle θ of smaller than or equal to 60°, preferably smaller than or equal to 45°, further preferably smaller than or equal to 30° is formed, and the end portion of the drain electrode layer and the end portion of the source electrode layer are formed over a region of the insulating layer 423, which overlaps with the channel formation region; thus, the transistor 420 in which the electric-field concentration is reduced can be manufactured.

Consequently, a highly reliable semiconductor device which includes the transistor 420 including the oxide semiconductor film 403 and having stable electric characteristics can be provided. Further, the highly reliable semiconductor device can be manufactured at a high yield, whereby high productivity is achieved.

FIGS. 10A and 10B, FIGS. 11A and 11B, FIGS. 12A and 12B, and FIGS. 13A and 13B show results of measuring electric characteristics and the reliability of the transistor 420 actually manufactured in accordance with the above process. The channel length L of the transistor is 9 μm and the channel width W of the transistor is 50 μm.

One of methods for examining reliability of transistors is a bias-temperature stress test (hereinafter, referred to as a BT test). The BT test is one kind of accelerated test and a change in characteristics, caused by long-term use, of transistors can be evaluated in a short time. In particular, the amount of shift in threshold voltage of the transistor between before and after the BT test is an important indicator for examining reliability. The smaller the shift in the threshold voltage between before and after a BT test means higher reliability.

Specifically, the temperature of the substrate over which the transistor is formed (substrate temperature) is set at fixed temperature, a source and a drain of the transistor are set at the same potential, and a gate is supplied with potential different from those of the source and the drain for a certain period. The substrate temperature may be determined as appropriate in accordance with the test purpose. A BT test in which a potential applied to a gate is higher than the potential of a source and a drain is referred to as +BT test and a BT test in which a potential applied to a gate is lower than the potential of a source and a drain is referred to as −BT test.

The stress condition of a BT test can be determined in accordance with a substrate temperature, the electric field intensity applied to a gate insulating film, and a time period of application of electric field. The intensity of the electric field applied to the gate insulating film is determined in accordance with a value obtained by dividing a potential difference between the gate and the source and drain by the thickness of the gate insulating film. For example, in the case where the intensity of the electric field applied to the gate insulating film with a thickness of 200 nm is to be 1.5 MV/cm, the potential difference may be set to 30 V.

Note that in general, a voltage refers to a difference between potentials of two points, and a potential refers to electrostatic energy (electric potential energy) of a unit charge at a point in an electrostatic field. However, in an electronic circuit, a difference between a potential at a certain point and a reference potential (e.g., a ground potential) is often referred to as the potential at a certain point. Thus, when a difference between a potential at a certain point and a reference potential (e.g., a ground potential) is referred to as the potential at a certain point, the potential at a certain point means the voltage except for the case where definition is particularly given.

Both a +BT test and a −BT test were carried out under the following conditions: the substrate temperature was 80° C.; the intensity of the electric field applied to the gate insulating film was 1.5 MV/cm; and the time of application was 2000 seconds.

First, the +BT test is described. To measure initial characteristics of the transistor subjected to the BT test, a change in characteristics of the source-drain current (hereinafter, referred to as the drain current), that is, $V_g$–$I_d$ characteristics were measured under the conditions where the substrate temperature was set to 40° C., the source-drain voltage (hereinafter, the drain voltage) was set to 10 V, and the source-gate voltage (hereinafter, the gate voltage) was changed from −30 V to +30 V. Here, as a countermeasure against moisture-absorption onto surfaces of the samples, the substrate temperature was set to 40° C. However, the measurement may be performed at room temperature (25° C.) or lower if there is no particular problem.

Next, the substrate temperature was increased to 80° C., and then, the potentials of the source and the drain of the transistor were set to 0 V. Then, voltage was applied to the gate of the transistor so that the intensity of the electric field applied to the gate insulating film was 1.5 MV/cm. In this example, since the thickness of the gate insulating film of the transistor was 200 nm, the gate was supplied with +30 V and was kept for 2000 seconds. The time of voltage application was 2000 seconds in this example; however, the time may be determined as appropriate in accordance with the purpose.

Next, the substrate temperature was decreased to 40° C. while the voltage was kept on being applied to the source, the drain, and the gate. If application of the voltage is stopped before the substrate temperature was decreased to 40° C., the transistor which has been damaged during the BT test is repaired by the influence of residual heat. Thus, the substrate temperature needs to be decreased while the voltage is applied. After the substrate temperature was reached to 40° C., the application of voltage was stopped.

Next, $V_g$–$I_d$ characteristics were measured under the same conditions as those of the measurement of the initial characteristics, and $V_g$–$I_d$ characteristics after the +BT test were obtained.

Next, the −BT test is described. The −BT test was performed in a manner similar to that of the +BT test, except in that the voltage applied to the gate of the transistor after the substrate temperature was increased to 80° C. was −30 V.

In the BT test, it is important to use a transistor which has been never subjected to a BT test. For example, if a −BT test is performed with use of a transistor which has been once subjected to a +BT test, the results of the −BT test cannot be evaluated correctly due to influence of the +BT test which has been performed previously. The same applies to the case where a +BT test is performed on a transistor which has been once subjected to a +BT test. Note that the same does not apply to the case where a BT test is intentionally repeated in consideration of these influences.

Figure 10A:
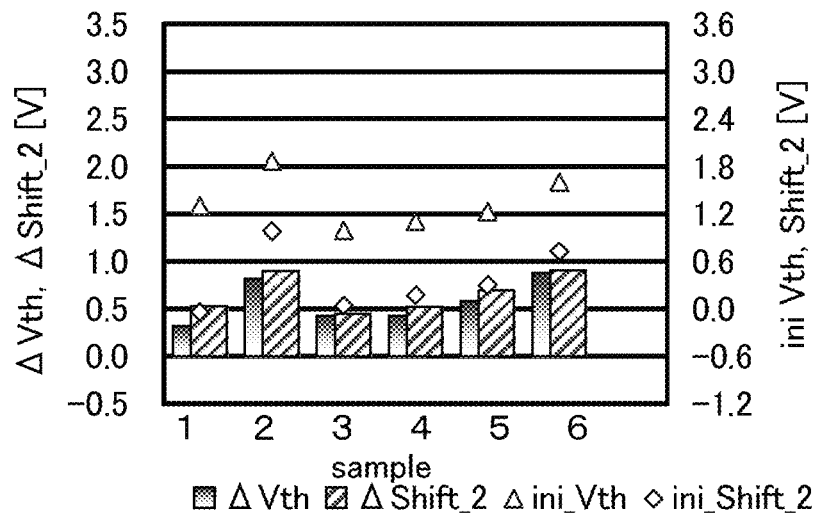
FIG. 10A is a graph showing electric characteristics before and after +BT tests at 80° C.
Figure 10B:
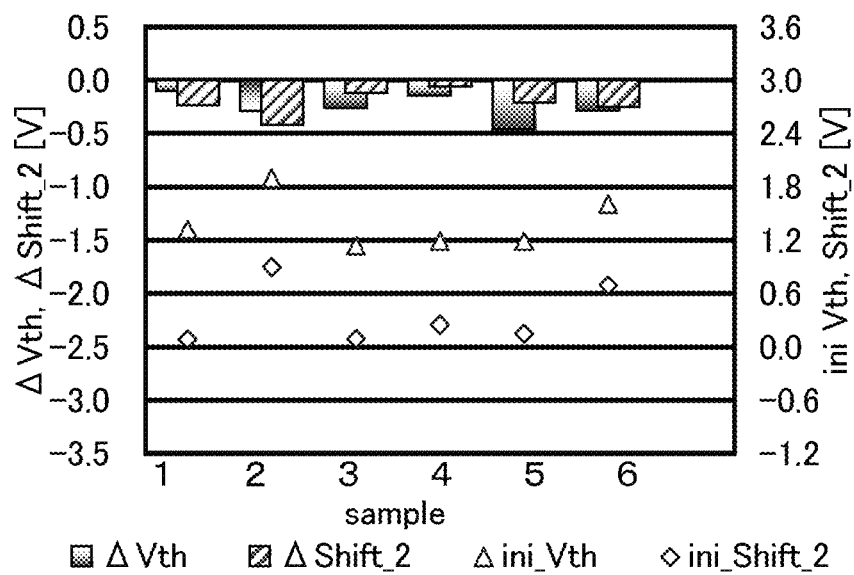
FIG. 10B is a graph showing electric characteristics before and after −BT tests at 80° C.

Initial characteristics (the threshold voltage and the shift value), and the amounts of shift in the threshold voltage and the shift value after BT tests of six samples manufactured using different substrates were measured. FIGS. 10A and 10B are graphs showing results of BT tests at 80° C. FIG. 10A shows data of a +BT test and FIG. 10B shows data of a −BT test.

The shift value (shift 2) means a voltage value at the rising of the Vg–Id characteristics curve in the case where Vd=10V, and is a gate voltage at which the drain current becomes lower than or equal to $1\times10^{-12}$ A. In this specification, the threshold voltage (Vth) is defined, in a curve where the abscissa and the ordinate indicate the gate voltage (Vg [V]) and the square root of drain current ($Id^{1/2}$ [A]), respectively, as gate voltage at an intersection of an extrapolated tangent of $Id^{1/2}$ having the highest inclination and the Vg axis (i.e., $Id^{1/2}$=0 [A]). Note that in this specification, threshold voltage is calculated with a drain voltage Vd of 10 V.

The amounts of shift in the threshold voltage and the shift value are important indicators for examining the reliability of the transistor. The smaller the shift in the threshold voltage and the shift value between before and after the BT test is, the higher the reliability is. The amounts of shift in the threshold voltage and the shift value are small in all the samples 1 to 6.

Note that a 100-nm-thick insulating layer on and in contact with the oxide semiconductor film is included in the sample 1 and the sample 2; a 200-nm-thick insulating layer on and in contact with the oxide semiconductor film is included in the sample 3 and the sample 4; and a 300-nm-thick insulating layer on and in contact with the oxide semiconductor film is included in the sample 5 and the sample 6. The samples 1, 3, and 5 each include a silicon oxide film deposited by a sputtering method as an interlayer insulating film (400 nm) covering the transistor, and the samples 2, 4, and 6 each include a silicon oxynitride film deposited by a plasma CVD method as the interlayer insulating film.

Figure 11A:
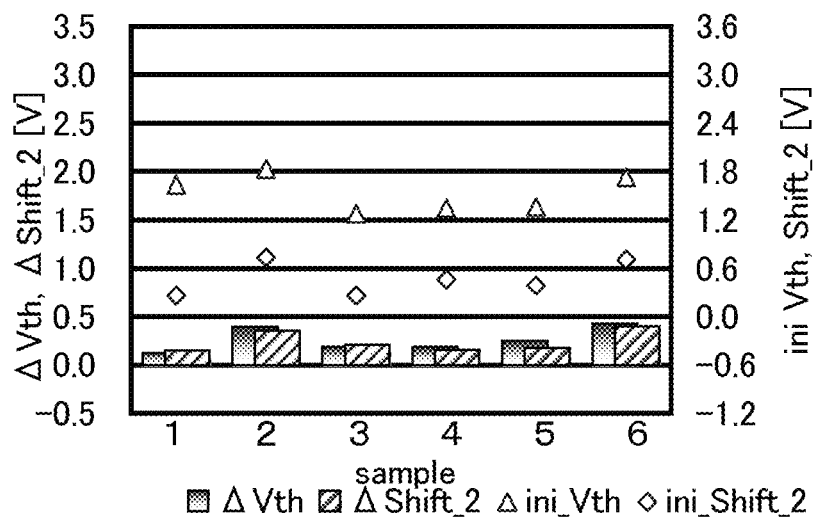
FIG. 11A is a graph showing electric characteristics before and after +BT tests at 25° C.
Figure 11B:
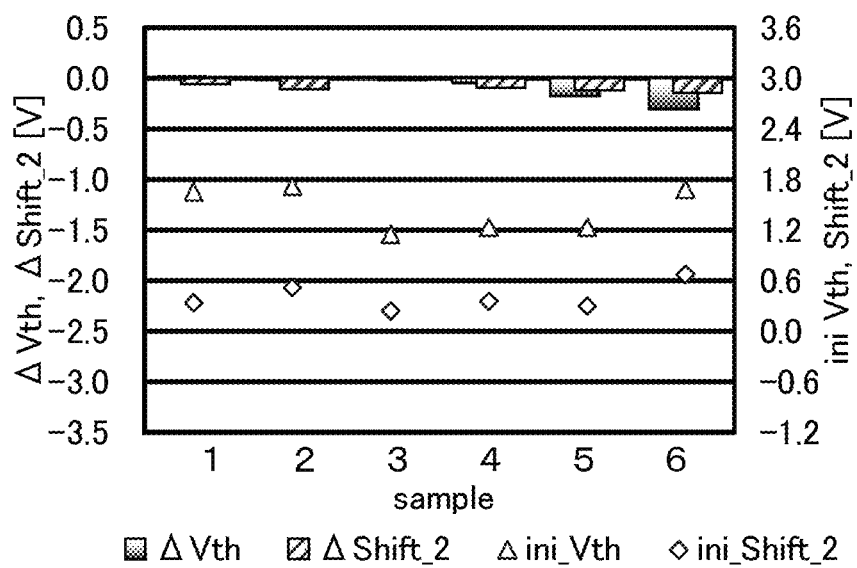
FIG. 11B is a graph showing electric characteristics before and after −BT tests at 25° C.

FIGS. 11A and 11B are graphs showing results at 25° C. In the sample 3, the threshold voltage shifts in the negative direction from that in the initial characteristics. However, the amounts of shift ΔVth and Δshift 2 are hardly seen in FIG. 11B because they are 0.01 V and −0.01 V, respectively, which are extremely close to 0, showing that the sample 3 has especially excellent characteristics. In addition, the amounts of shift ΔVth of the sample 1 and the sample 2 are hardly seen in FIG. 11B because they are 0.02 V.

Figure 12A:
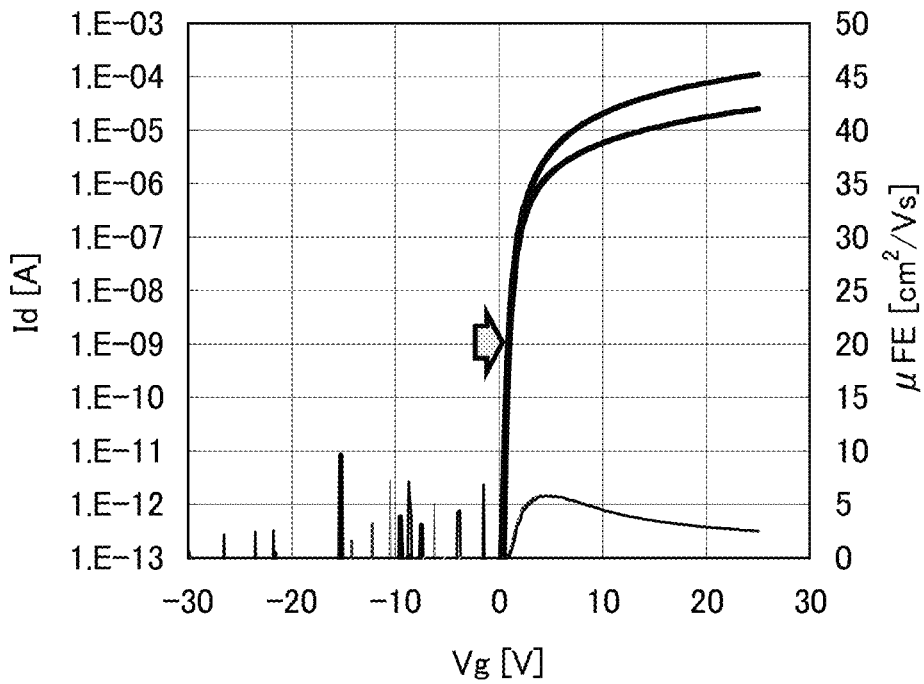
FIG. 12A is a graph showing the Vg-Id characteristics of a transistor before and after a +BT test and FIG. 12B is a graph showing the Vg-Id characteristics of the transistor before and after a −BT test.
Figure 12B:
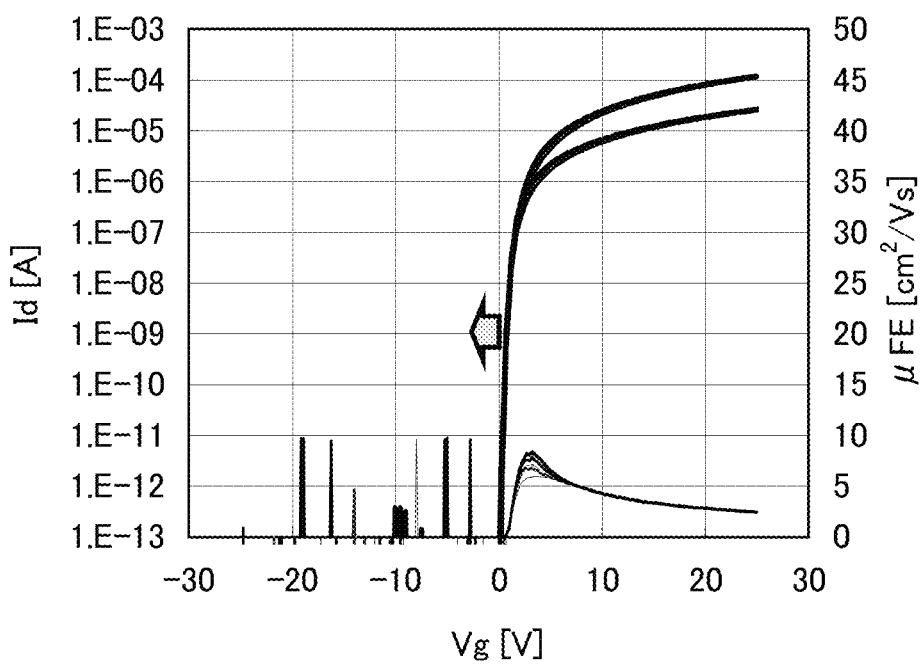

From the results at 25° C., a sample with the smallest shifts in the threshold voltage and shift value is the sample 3; thus, FIG. 12A shows the Vg–Id characteristics of the transistor of the sample 3 before and after the +BT test and FIG. 12B shows the Vg–Id characteristics of the transistor of the sample 3 before and after the −BT test.

According to FIG. 12A, the threshold voltage shifts in the positive direction from that in the initial characteristics. However, the amounts of shift ΔVth and Δshift 2 are 0.19 V and 0.21 V, respectively, which are extremely close to 0, showing that the sample 3 has excellent characteristics. Further, according to FIG. 12B, the threshold voltage shifts in the negative direction from that in the initial characteristics. However, the amounts of shift ΔVth and Δshift 2 are 0.01 V and −0.01 V, respectively, which are extremely close to 0, showing that the sample 3 has excellent characteristics.

A BT test with light irradiation was performed. Needless to say, samples used here were different from the samples on which the above BT test was performed. The test method is the same as that of the above BT test, except for a point that the transistors were irradiated with light of 3000 lux from a LED light source. Since there was almost no change between before and after performance of +BT test while the transistors were irradiated with light, the description of the results were omitted here.

Figure 13A:
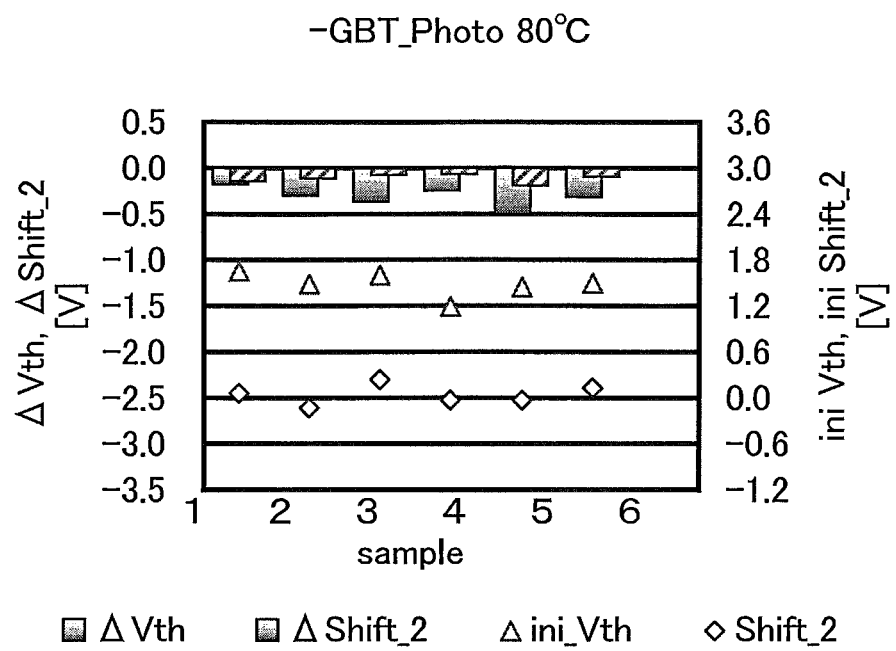
FIG. 13A is a graph showing electric characteristics before and after −BT tests at 80° C. performed while a transistor is irradiated with light
Figure 13B:
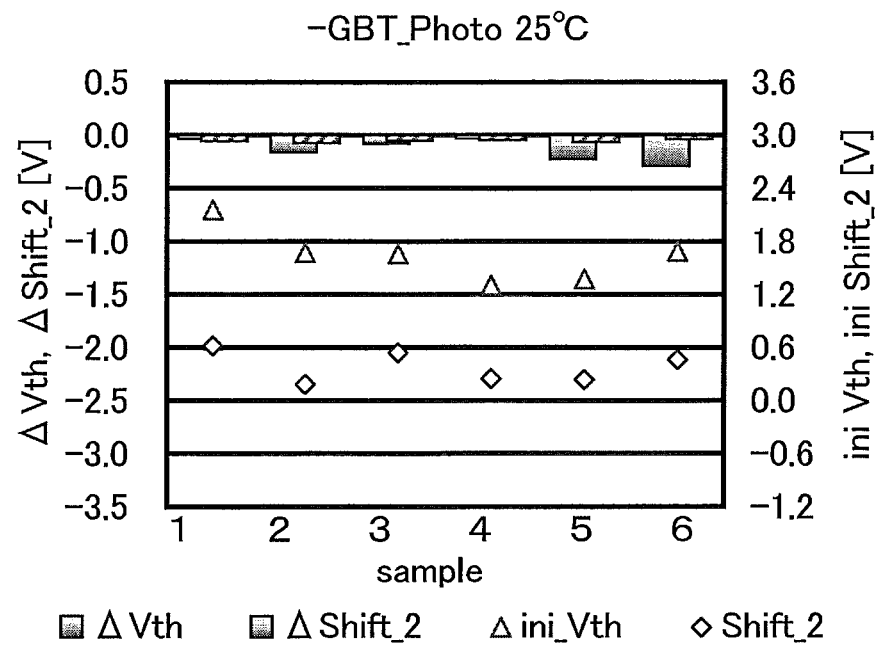
FIG. 13B is a graph showing electric characteristics before and after −BT tests at 25° C. performed while the transistor is irradiated with light.

FIGS. 13A and 13B show results of a −BT test performed with light irradiation. FIG. 13A shows results at a stress temperature of 80° C. and FIG. 13B shows results at a stress temperature of room temperature (25° C.).

According to the results of the −BT test with light irradiation at a stress temperature of 80° C., the amounts of shift ΔVth in the threshold voltage and Δshift 2 of the transistor of the sample 3 from those in the initial characteristics can be −0.36 V and −0.65 V, respectively. Further, according to the results at a stress temperature of 25° C., the amounts of shift ΔVth in the threshold voltage and Δshift 2 of the transistor of the sample 3 from those in the initial characteristics can be −0.36 V and −0.08 V, respectively. It is thus confirmed that the transistor is highly reliable.

These results of reliability and electric characteristics show that the structure illustrated in FIGS. 8A and 8B, i.e., the transistor 420 in which the insulating layer (having a thickness of 100 nm to 300 nm) whose end portion is tapered (with the taper angle of about)30° is on and in contact with the oxide semiconductor film, has high electric characteristics and high reliability.

A transistor including an oxide semiconductor differs from a transistor in which silicon is used as a semiconductor in the following point. In the transistor including an oxide semiconductor, holes are not induced as carriers in an oxide semiconductor film (channel formation region) when −Vgs (−GBT) stress is applied, so that the electric field might be applied to a back channel, which might cause deterioration. In the case where the end portion of the insulating layer provided on and in contact with the channel formation region is tapered, the electric-field concentration in the end portion of the drain electrode layer where the electric-field is especially concentrated when such −Vgs (−GBT) stress is applied can be reduced more effectively.

(Embodiment 5)

A semiconductor device having a display function (also referred to as a display device) can be manufactured using the transistor described in Embodiment 3 or 4. Further, part or all of the driver circuitry which includes the transistor can be formed over a substrate where a pixel portion is formed, whereby a system-on-panel can be formed.

Figure 14A:
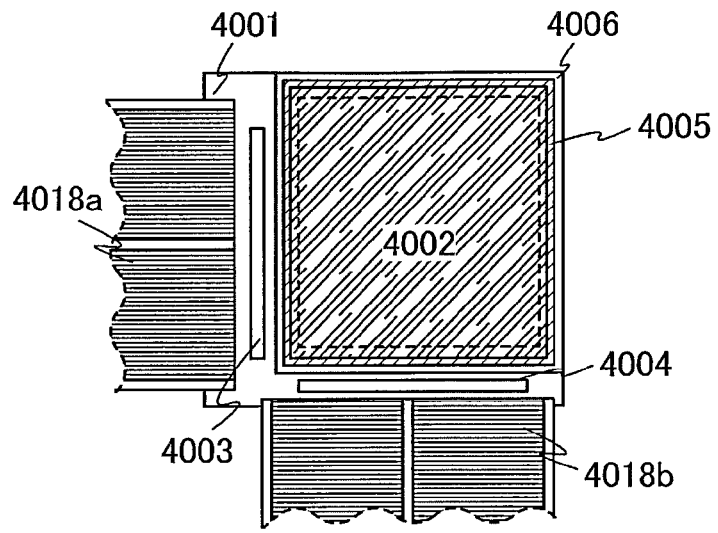
FIGS. 14A to 14C are plan views each illustrating one embodiment of a semiconductor device.

In FIG. 14A, a sealant 4005 is provided so as to surround a pixel portion 4002 provided over a first substrate 4001, and the pixel portion 4002 is sealed with a second substrate 4006. In FIG. 14A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 14B:
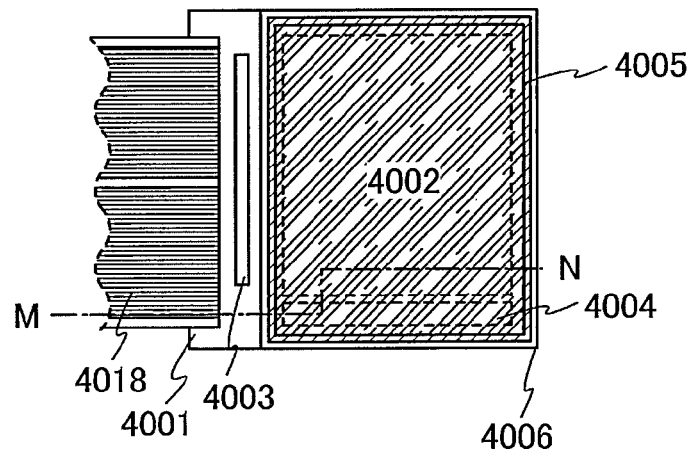
Figure 14C:
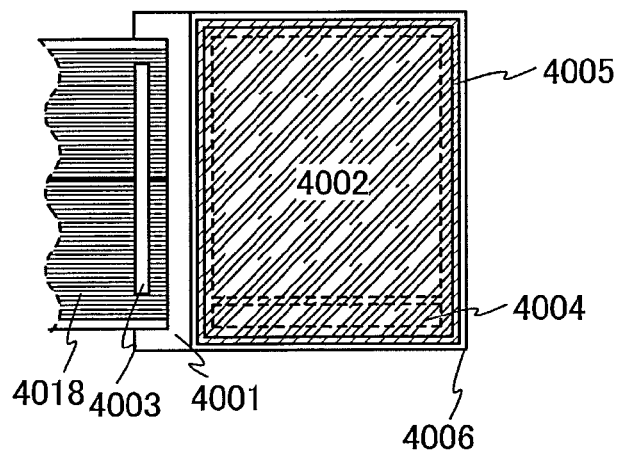

In FIGS. 14B and 14C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 14B and 14C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 14B and 14C, a variety of signals and potentials are supplied to the signal line driver circuit 4003 which is separately formed, the scan line driver circuit 4004, and the pixel portion 4002 from an FPC 4018.

Although FIGS. 14B and 14C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 14A illustrates an example in which the signal line driver circuit 4003 and the scan line driver circuit 4004 are mounted by a COG method. FIG. 14B illustrates an example in which the signal line driver circuit 4003 is mounted by a COG method. FIG. 14C illustrates an example in which the signal line driver circuit 4003 is mounted by a TAB method.

The display device includes, in its category, a panel in which a display element is sealed, and a module in which an IC such as a controller or the like is mounted on the panel.

Note that a display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 3 or 4 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

Embodiments of the semiconductor device will be described with reference to FIGS. 14A to 14C, FIGS. 15A and 15B, and FIGS. 16A and 16B. FIGS. 16A and 16B correspond to cross-sectional views taken along line M-N in FIG. 14B.

As illustrated in FIGS. 14A to 14C and FIGS. 16A and 16B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as gate electrode layers of transistors 4040 and 4011.

The pixel portion 4002 and the scan line driver circuit 4004 which are provided over the first substrate 4001 include a plurality of transistors. FIGS. 16A and 16B illustrate the transistor 4040 included in the pixel portion 4002 and the transistor 4011 included in the scan line driver circuit 4004. In FIG. 16A, an insulating film 4020 is provided over the transistors 4040 and 4011, and in FIG. 16B, an insulating film 4021 is further provided. Note that an insulating film 4023 is an insulating film serving as a base film.

The transistor described in Embodiment 3 or 4 can be applied to a transistor 4010, the transistor 4011, and the transistor 4040. In this embodiment, an example in which a transistor having a structure similar to that of the transistor 440 described in Embodiment 3 is used will be described. The transistors 4010 and 4011 are bottom-gate transistors in each of which an insulating layer functioning as a channel protective film is provided over an oxide semiconductor film.

In the transistors 4010 and 4011 each having a structure similar to that of the transistor 440 described in Embodiment 3, the insulating layer described in Embodiment 1 or 2 can be used as an insulating layer provided over a channel formation region. When the insulating layer described in Embodiment 1 or 2 is used and an end portion of a drain electrode layer and an end portion of a source electrode layer are formed over a region where the insulating layer overlaps with the channel formation region, a transistor in which the electric-field concentration is reduced can be manufactured.

Alternatively, a structure similar to that of the transistor 420 described in Embodiment 4 may be applied to the transistors 4010 and 4011. In the transistor described in Embodiment 4, the insulating layer functioning as a channel protective film is provided over the oxide semiconductor film; at least over the channel formation region in the oxide semiconductor film which overlaps with the gate electrode layer. In addition, the opening which reaches the oxide semiconductor film is provided so that the source electrode layer or the drain electrode layer covers the inner wall of the opening. When the end portion of the drain electrode layer and the end portion of the source electrode layer are formed over a region where the insulating layer overlaps with the channel formation region, the electric-field concentration in the transistor described in Embodiment 4 is reduced as well.

Thus, a highly reliable semiconductor device can be provided as any of the semiconductor devices, illustrated in FIGS. 14A to 14C and FIGS. 16A and 16B, which includes the transistors 4010 and 4011 of this embodiment each including the oxide semiconductor film and having stable electric characteristics. Further, such a highly reliable semiconductor device can be manufactured with a high yield, so that high productivity can be achieved.

A conductive layer may be further provided so as to overlap with the channel formation region in the oxide semiconductor film of the transistor 4011 for the driver circuit. By providing the conductive layer so as to overlap with the channel formation region in the oxide semiconductor film, the amount of change in the threshold voltage of the transistor 4011 between before and after a bias-temperature stress test (BT test) can be further reduced. The conductive layer may have the same potential as a gate electrode layer of the transistor 4011, or the conductive layer can have a potential different from that of the gate electrode layer of the transistor 4011 to function as a second gate electrode layer. The potential of the conductive layer may be GND or 0 V, or the conductive layer may be in a floating state.

In addition, the conductive layer has a function of blocking an external electric field, that is, a function of preventing an external electric field (particularly, a function of preventing static electricity) from affecting the inside (circuit portion including a transistor). The blocking function of the conductive layer can prevent fluctuation in the electrical characteristics of the transistor due to an influence of an external electric field such as static electricity.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is illustrated in FIG. 16A. In FIG. 16A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor including an oxide semiconductor film.

The specific resistivity of the liquid crystal material is higher than or equal to $1 \times 10^9$ $\Omega \cdot cm$, preferably higher than or equal to $1 \times 10^{11}$ $\Omega \cdot cm$, further preferably higher than or equal to $1 \times 10^{12}$ $\Omega \cdot cm$. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using the transistor including an oxide semiconductor film, which is disclosed in this specification, it is enough to provide a storage capacitor having a capacitance that is ⅓ or less, preferably ⅕ or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

To extract light emitted from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

FIGS. 15A and 15B and FIG. 16B illustrate examples of a light-emitting device including a light-emitting element as a display element.

FIG. 15A is a plan view of a light-emitting device and FIG. 15B is a cross-sectional view taken along dashed-dotted lines V1-W1, V2-W2, and V3-W3 in FIG. 15A. Note that, an electroluminescent layer 542 and a second electrode layer 543 are not illustrated in the plan view in FIG. 15A.

The light-emitting device illustrated in FIGS. 15A and 15B includes, over a substrate 500 provided with an insulating film 501 functioning as a base film, a transistor 510, a capacitor 520, and an intersection 530 of wiring layers. The transistor 510 is electrically connected to a light-emitting element 540. Note that FIGS. 15A and 15B illustrate a bottom-emission light-emitting device in which light from the light-emitting element 540 is extracted through the substrate 500.

The transistor described in Embodiment 3 or 4 can be applied to the transistor 510. In this embodiment, an example in which a transistor having a structure similar to that of the transistor 420 described in Embodiment 4 is used will be described. The transistor 510 is an inverted-staggered transistor with a bottom-gate structure, in which an insulating layer functioning as a channel protective film is provided over an oxide semiconductor film.

The transistor 510 includes gate electrode layers 511a and 511b, a gate insulating film 502, an oxide semiconductor film 512, an insulating layer 503, and conductive layers 513a and 513b functioning as a source electrode layer and a drain electrode layer.

In the transistor 510 having a structure similar to that of the transistor 420 described in Embodiment 4, the cross-sectional shape of part of the insulating layer 503 (a region overlapping with a channel formation region) is a trapezoid and the taper angle θ of a lower end portion of the cross-sectional shape is smaller than or equal to 60°, preferably smaller than or equal to 45°, further preferably smaller than or equal to 30°. The insulating layer 503 functioning as a channel protective film is provided over the oxide semiconductor film 512; at least over the channel formation region in the oxide semiconductor film 512 which overlaps with the gate electrode layers 511a and 511b. In addition, openings which reach the oxide semiconductor film 512 are provided so that the conductive layers 513a and 513b functioning as the source electrode layer and the drain electrode layer cover the inner walls of the openings.

Alternatively, a structure similar to that of the transistor 440 described in Embodiment 3 may be applied to the transistor 510. The cross-sectional shape of the part of the insulating layer 503 (the region overlapping with the channel formation region) may be the same as the cross-sectional shape of the insulating layer described in Embodiment 1 or 2. When the part of the insulating layer 503 has the same cross-sectional shape as the insulating layer described in Embodiment 1 or 2, the transistor 510 in which the electric-field concentration is reduced can be manufactured.

Thus, a highly reliable semiconductor device can be provided as the semiconductor device, illustrated in FIGS. 15A and 15B, which includes the transistor 510 of this embodiment each including the oxide semiconductor film 512 and having stable electric characteristics. Further, such a highly reliable semiconductor device can be manufactured with a high yield, so that high productivity can be achieved.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 and the insulating layer 503 provided therebetween. In the structure described in Embodiment 4, not only the gate insulating film 502 but also the insulating layer 503 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked-layer structure of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 16B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrode layers 4030 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

In FIGS. 14A to 14C, FIGS. 15A and 15B, and FIGS. 16A and 16B, a flexible substrate as well as a glass substrate can be used as any of the first substrates 4001 and 500 and the second substrate 4006. For example, a plastic substrate having a light-transmitting property or the like can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

The insulating films 4021 and 506 serving as planarization insulating films can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

There is no particular limitation on the methods of forming the insulating films 4021 and 506, and any of the following methods can be used depending on the material: a sputtering method, an SOG method, a spin coating method, a dipping method, a spray coating method, a droplet discharge method (inkjet method), a screen printing method, an offset printing method, and the like.

The display device displays an image by transmitting light from a light source or a display element. Thus, the substrate and the thin films such as the insulating film and the conductive film provided for the pixel portion where light is transmitted have light-transmitting properties with respect to light in the visible light wavelength range.

The first electrode layer and the second electrode layer (which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

In this embodiment, since the light-emitting device illustrated in FIGS. 15A and 15B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in Embodiment 1 or 2, a semiconductor device having a variety of functions can be provided.

The structures, methods, and the like described in this embodiment can be combined as appropriate with any of the structures, methods, and the like described in the other embodiments.

(Embodiment 6)

A semiconductor device having an image sensor function of reading information on an object can be manufactured using the transistor described in Embodiment 3 or 4.

Figure 17A:
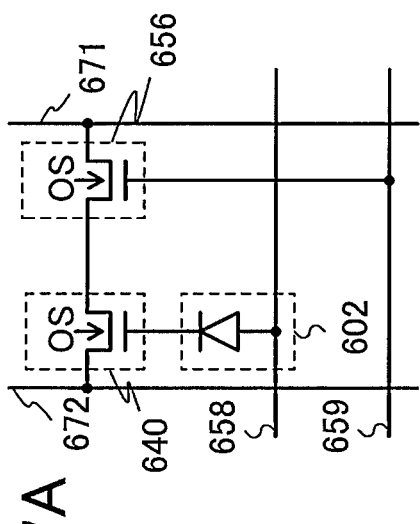
FIGS. 17A and 17B are a circuit diagram and a cross-sectional view of one embodiment of a semiconductor device.

FIG. 17A illustrates an example of a semiconductor device having an image sensor function. FIG. 17A is an equivalent circuit diagram of a photosensor, and FIG. 17B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in a circuit diagram in this specification, a transistor including an oxide semiconductor film is denoted by a symbol "OS" so that it can be identified as a transistor including an oxide semiconductor film. In FIG. 17A, the transistor 640 and the transistor 656 are each a transistor including an oxide semiconductor film, to which the transistor described in Embodiment 1, 3, or 4 can be applied. Described in this embodiment is an example in which a transistor having a structure similar to that of the transistor 440 described in Embodiment 3 is used. The transistor 640 is a bottom-gate transistor in which an insulating layer functioning as a channel protective film is provided over an oxide semiconductor film.

Figure 17B:
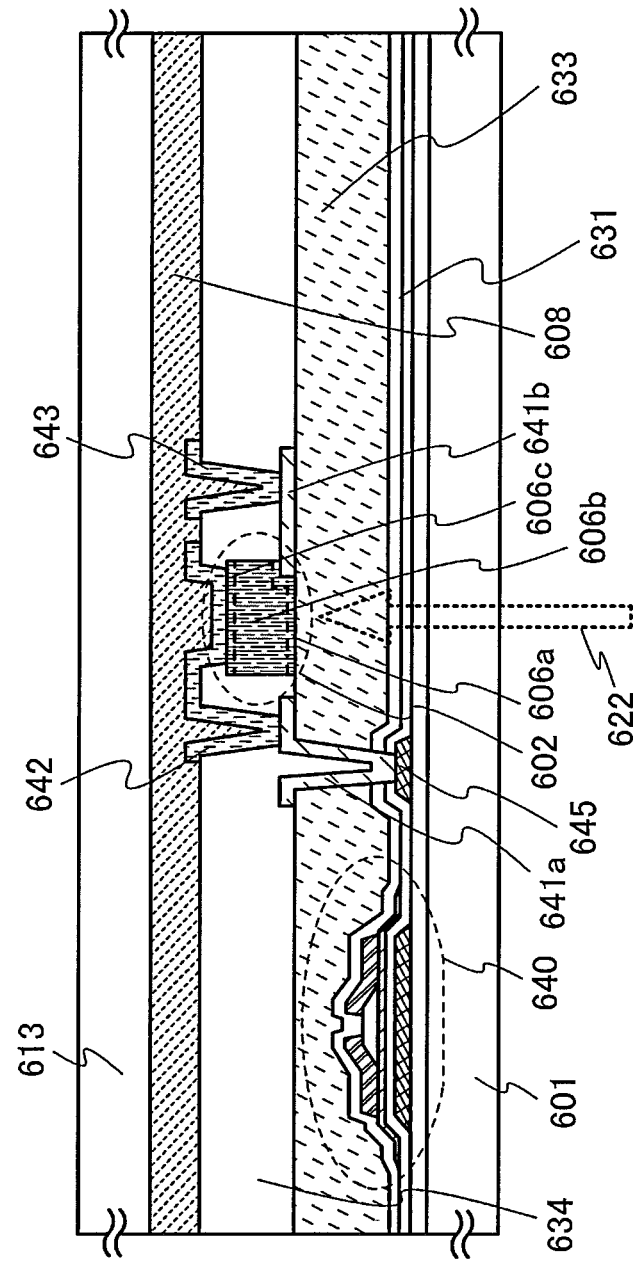

FIG. 17B is a cross-sectional view of the photodiode 602 and the transistor 640 in the photosensor. The transistor 640 and the photodiode 602 functioning as a sensor are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 642 formed over the interlayer insulating film 634 and electrode layers 641a and 641b formed over the interlayer insulating film 633.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Thus, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; thus, the electrode layer is preferably formed using a light-blocking conductive film. Note that a surface on the n-type semiconductor film side can alternatively be used as the light-receiving plane.

With the use of an insulating material, the insulating film 631, the interlayer insulating film 633 and the interlayer insulating film 634 can be formed, depending on the material, by a sputtering method, a plasma CVD method, an SOG method, a spin coating method, a dipping method, a spray coating method, a droplet discharge method (inkjet method), a screen printing method, an offset printing method, or the like.

The insulating film 631 can be formed using an inorganic insulating material and can have a single-layer structure or a stacked-layer structure including any of oxide insulating films such as a silicon oxide film, a silicon oxynitride film, an aluminum oxide film, and an aluminum oxynitride film; and nitride insulating films such as a silicon nitride film, a silicon nitride oxide film, an aluminum nitride film, and an aluminum nitride oxide film.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance such as polyimide, an acrylic resin, a benzocyclobutene-based resin, a polyamide resin, or an epoxy resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on an object to be detected.

In the transistor 640 having a structure similar to that of the transistor 440 described in Embodiment 3, the insulating layer described in Embodiment 1 or 2 can be used as an insulating layer provided over a channel formation region. When the insulating layer described in Embodiment 1 or 2 is used and an end portion of a drain electrode layer and an end portion of a source electrode layer are formed over a region where the insulating layer overlaps with the channel formation region, a transistor in which the electric-field concentration is reduced can be manufactured.

Alternatively, a structure similar to that of the transistor 420 described in Embodiment 4 may be applied to the transistor 640. In the transistor described in Embodiment 4, the insulating layer functioning as a channel protective film is provided over the oxide semiconductor film; at least over the channel formation region in the oxide semiconductor film which overlaps with the gate electrode layer. In addition, the opening which reaches the oxide semiconductor film is provided so that the source electrode layer or the drain electrode layer covers the inner wall of the opening. When the end portion of the drain electrode layer and the end portion of the source electrode layer are formed over a region where the insulating layer overlaps with the channel formation region, the electric-field concentration in the transistor described in Embodiment 4 is reduced as well.

Thus, a highly reliable semiconductor device including the transistor 640 of this embodiment including the oxide semiconductor film and having stable electric characteristics can be provided. Further, a highly reliable semiconductor device can be manufactured with a high yield, so that high productivity can be achieved.

The structures, methods, and the like described in this embodiment can be combined as appropriate with any of the structures, methods, and the like described in the other embodiments.

(Embodiment 7)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of such electronic devices are illustrated in FIGS. 18A to 18C.

Figure 18A:
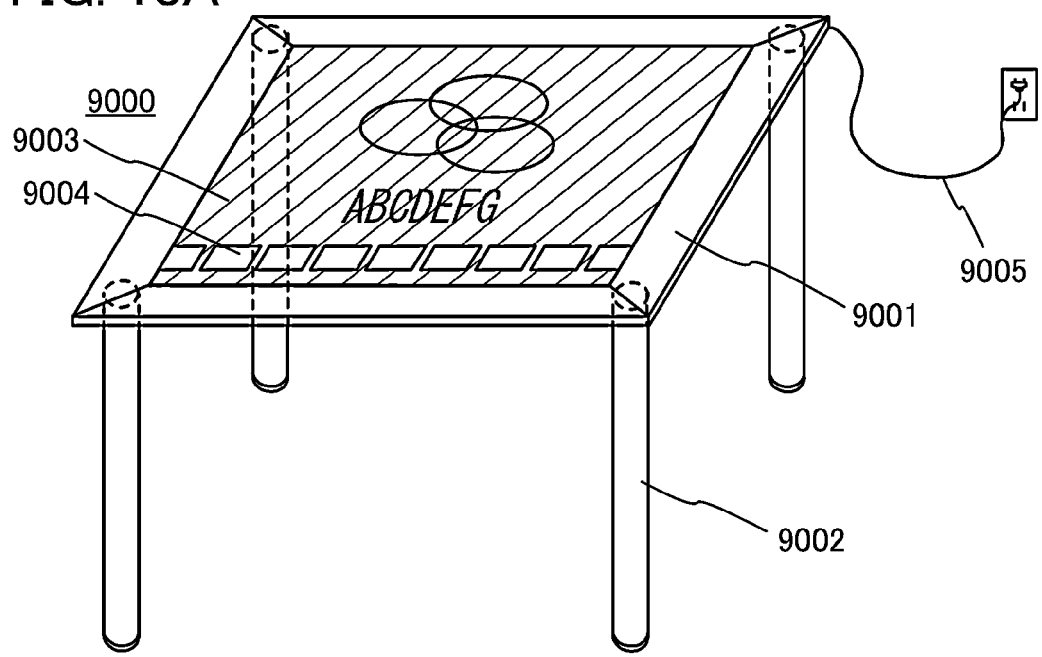
FIGS. 18A to 18C illustrate electronic devices.
Figure 18B:
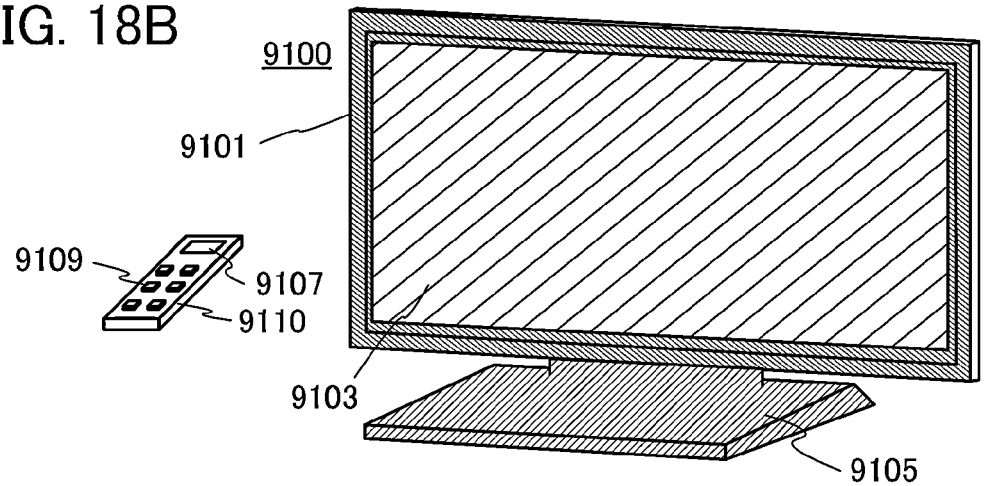
Figure 18C:
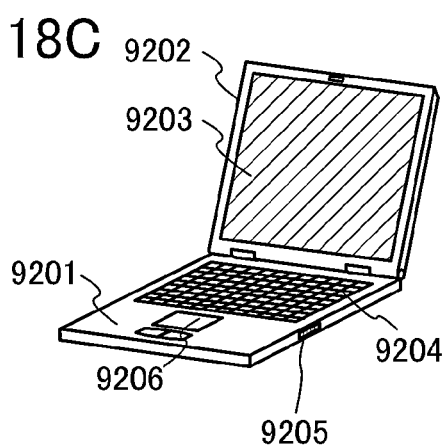

FIG. 18A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 6 can be used for the display portion 9003 so that the electronic device can have a high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television set. A television set with a large screen takes up too much space that is available in a small room. However, with a table having a display portion therein, it is possible to make the use of the space in the room.

FIG. 18B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 18B is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

The semiconductor device described in any of Embodiments 1 to 6 can be used for the display portions 9103 and 9107 so that the television set and the remote controller can have a high reliability.

FIG. 18C illustrates a computer which includes a main body 9201, a housing 9202, a display portion 9203, a keyboard 9204, an external connection port 9205, a pointing device 9206, and the like. The computer includes a semiconductor device manufactured in accordance with one embodiment of the present invention for the display portion 9203. When the semiconductor device described in the above embodiment is used, the computer can have a high reliability.

Figure 19A:
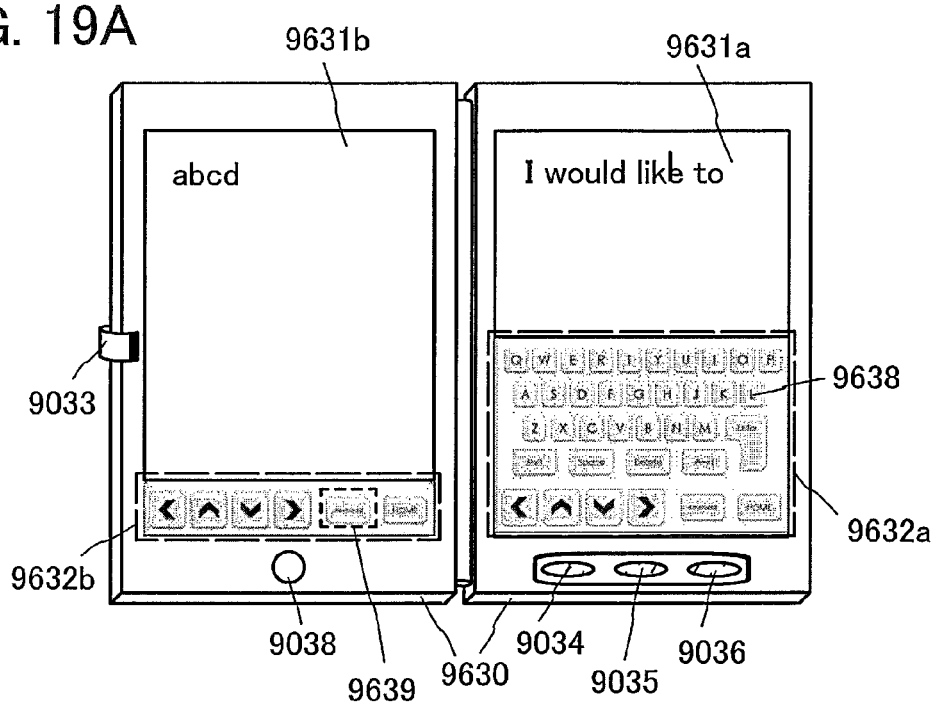
FIGS. 19A to 19C illustrate an electronic device.
Figure 19B:
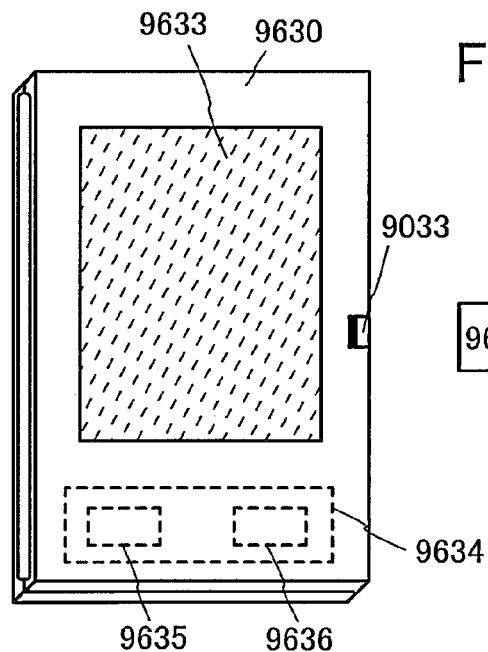

FIGS. 19A and 19B illustrate a tablet terminal that can be folded. In FIG. 19A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of Embodiments 1 to 6 can be used for the display portion 9631a and the display portion 9631b so that the tablet terminal can have a high reliability.

A touch panel area 9632a can be provided in part of the display portion 9631a, in which area, data can be input by touching displayed operation keys 9638. Note that half of the display portion 9631a has only a display function and the other half has a touch panel function. However, one embodiment of the present invention is not limited to this structure, and the whole display portion 9631a may have a touch panel function. For example, the display portion 9631a can display a keyboard in the whole region to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, another detecting device such as a sensor for detecting inclination, like a gyroscope or an acceleration sensor, may be incorporated in the tablet terminal.

Although the display portion 9631a and the display portion 9631b have the same display area in FIG. 19A, one embodiment of the present invention is not limited to this example. The display portion 9631a and the display portion 9631b may have different areas or different display quality. For example, higher definition images may be displayed on one of the display portions 9631a and 9631b.

FIG. 19B illustrates the tablet terminal folded, which includes the housing 9630, a solar battery 9633, a charge and discharge control circuit 9634, a battery 9635, and a DCDC converter 9636. Note that FIG. 19B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 19A and 19B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. The use of a lithium ion battery as the battery 9635 is advantageous in downsizing or the like.

Figure 19C:
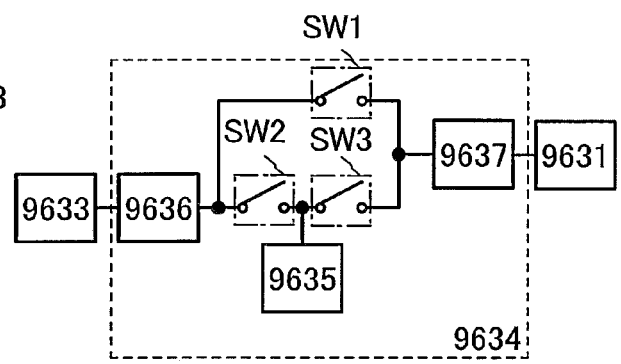

The structure and operation of the charge and discharge control circuit 9634 illustrated in FIG. 19B are described with reference to a block diagram of FIG. 19C. FIG. 19C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 19B.

First, description is made on an example of the operation in the case where power is generated by the solar battery 9633 using external light. The voltage of power generated by the solar battery is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9637 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

This application is based on Japanese Patent Application serial no. 2011-215599 filed with Japan Patent Office on Sep. 29, 2011, the entire contents of which are hereby incorporated by reference.

What is claimed is:

1. A semiconductor device comprising:
   a gate electrode layer over an insulating surface;
   a gate insulating film over the gate electrode layer;
   an oxide semiconductor film comprising a channel formation region over the gate insulating film;
   an insulating layer over and in contact with the oxide semiconductor film;
   a source electrode layer having an end portion over the insulating layer; and
   a drain electrode layer having an end portion over the insulating layer,
   wherein the end portion of the source electrode layer and the end portion of the drain electrode layer overlap with the channel formation region,
   wherein the source electrode layer is in direct contact with a surface of the oxide semiconductor film through a first opening,
   wherein the drain electrode layer is in direct contact with the surface of the oxide semiconductor film through a second opening,
   wherein the first opening comprises a first portion and a second portion,
   wherein the first portion of the first opening overlaps with the gate electrode layer and the second portion of the first opening does not overlap with the gate electrode layer, and
   wherein an angle between a side surface of an end portion of the insulating layer and the insulating surface is smaller than or equal to 60°.

2. The semiconductor device according to claim 1, wherein a thickness of the insulating layer is less than or equal to 0.3 μm.

3. The semiconductor device according to claim 1, wherein the end portion of the drain electrode layer overlaps with a top surface of the insulating layer.

4. The semiconductor device according to claim 1, wherein the end portion of the drain electrode layer overlaps with a side surface of the end portion of the insulating layer.

5. The semiconductor device according to claim 1, wherein a cross-sectional shape of the insulating layer is a trapezoid.

6. The semiconductor device according to claim 1, wherein a cross-sectional shape of the insulating layer is a triangle.

7. The semiconductor device according to claim 1, wherein at least part of a cross-sectional shape of the insulating layer is curved.

8. The semiconductor device according to claim 1, wherein the oxide semiconductor film comprises at least one selected from the group consisting of indium, gallium, and zinc.

9. A display module comprising the semiconductor device according to claim 1, comprising at least one of an FPC and a housing.

10. An electronic device comprising the semiconductor device according to claim 1, comprising at least one of a display portion, a battery, and an operation key.

11. A semiconductor device comprising:
a gate electrode layer over an insulating surface;
a gate insulating film over the gate electrode layer;
an oxide semiconductor film comprising a channel formation region over the gate insulating film;
an insulating layer over and in contact with the oxide semiconductor film;
a source electrode layer having an end portion over the insulating layer; and
a drain electrode layer having an end portion over the insulating layer,
wherein the end portion of the source electrode layer and the end portion of the drain electrode layer overlap with the channel formation region,
wherein the source electrode layer is in direct contact with a surface of the oxide semiconductor film through a first opening,
wherein the drain electrode layer is in direct contact with the surface of the oxide semiconductor film through a second opening,
wherein the first opening comprises a first portion and a second portion,
wherein the first portion of the first opening overlaps with the gate electrode layer and the second portion of the first opening does not overlap with the gate electrode layer,
wherein an angle between a side surface of an end portion of the insulating layer and the insulating surface is smaller than or equal to 60°, and
wherein a thickness of the insulating layer is less than or equal to 0.3 µm.

12. The semiconductor device according to claim 11, wherein the thickness of the insulating layer is greater than or equal to 5 nm and less than or equal to 0.1 µm.

13. The semiconductor device according to claim 11, wherein the end portion of the drain electrode layer overlaps with a top surface of the insulating layer.

14. The semiconductor device according to claim 11, wherein the end portion of the drain electrode layer overlaps with the side surface of the end portion of the insulating layer.

15. The semiconductor device according to claim 11, wherein a cross-sectional shape of the insulating layer is a trapezoid.

16. The semiconductor device according to claim 11, wherein a cross-sectional shape of the insulating layer is a triangle.

17. The semiconductor device according to claim 11, wherein at least part of a cross-sectional shape of the insulating layer is curved.

18. The semiconductor device according to claim 11, wherein the oxide semiconductor film comprises at least one selected from the group consisting of indium, gallium, and zinc.

19. A display module comprising the semiconductor device according to claim 11, comprising at least one of an FPC and a housing.

20. An electronic device comprising the semiconductor device according to claim 11, comprising at least one of a display portion, a battery, and an operation key.

* * * * *